(12) United States Patent
Araki

(10) Patent No.: US 8,878,564 B2
(45) Date of Patent: Nov. 4, 2014

(54) IMPEDANCE ADJUSTMENT CIRCUIT WITH CORRECTION CIRCUIT FOR SEMICONDUCTOR DEVICE

(75) Inventor: Hiroei Araki, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 188 days.

(21) Appl. No.: 13/545,618

(22) Filed: Jul. 10, 2012

(65) Prior Publication Data

US 2013/0015879 A1 Jan. 17, 2013

(30) Foreign Application Priority Data

Jul. 11, 2011 (JP) .................................. 2011-152837

(51) Int. Cl.
*H03K 19/003* (2006.01)
*H03K 19/0185* (2006.01)

(52) U.S. Cl.
CPC .. *H03K 19/00369* (2013.01); *H03K 19/018585* (2013.01); *H03K 19/018557* (2013.01)
USPC ................ 326/30; 326/86; 324/601; 324/108

(58) Field of Classification Search
None
See application file for complete search history.

(56) References Cited

U.S. PATENT DOCUMENTS

| | | | | |
|---|---|---|---|---|
| 7,215,128 B2* | 5/2007 | Fujisawa | ....................... | 324/601 |
| 7,489,159 B2* | 2/2009 | Kim | ............................. | 326/30 |
| 7,612,579 B2* | 11/2009 | Fujisawa | ....................... | 326/30 |
| 7,852,111 B2* | 12/2010 | Oguri | .............................. | 326/30 |
| 7,888,968 B2* | 2/2011 | Dreps et al. | ..................... | 326/82 |
| 7,898,290 B2* | 3/2011 | Kim | ............................. | 326/30 |
| 7,906,986 B2* | 3/2011 | Lee | ................................ | 326/30 |
| 8,461,867 B2* | 6/2013 | Kuwahara et al. | ............. | 326/30 |

FOREIGN PATENT DOCUMENTS

| | | |
|---|---|---|
| JP | 2007-213786 A | 8/2007 |
| JP | 2008-228332 A | 9/2008 |

* cited by examiner

*Primary Examiner* — Alexander H Taningco
*Assistant Examiner* — Nelson Correa
(74) *Attorney, Agent, or Firm* — Sughrue Mion, PLLC

(57) ABSTRACT

A device includes an output circuit including a plurality of unit buffers, each of the unit buffers having an adjustable impedance; a controller circuit operable to selectively activate at least one of the unit buffers; and an impedance adjustment part operable to adjust the impedance of each of the unit buffers in response to a change of the number of the unit buffers that are selectively activated by the controller circuit.

18 Claims, 10 Drawing Sheets

FIG. 6A

| DRZQ1 | 10h | DRZQ15 | 1 | DRZQ14 | 0 | DRZQ13 | 0 | DRZQ12 | 0 | DRZQ11 | 0 | | |
|---|---|---|---|---|---|---|---|---|---|---|---|---|---|
| CORRECTION VALUE=-1 | 1Fh | d5 | 1 | d4 | 1 | d3 | 1 | d2 | 1 | d1 | 1 | | |
| DRZQ1d | 0Fh | DRZQ1d5 | 0 | DRZQ1d4 | 1 | DRZQ1d3 | 1 | DRZQ1d2 | 1 | DRZQ1d1 | 1 | CARY5d | 0 |
| | | EXOR525 | 0 | EXOR524 | 0 | EXOR523 | 0 | EXOR522 | 0 | EXOR501 | 0 | | |
| | | AND515 | 1 | AND514 | 0 | AND513 | 0 | AND512 | 0 | AND511 | 0 | | |
| | | EXOR505 | 0 | EXOR504 | 1 | EXOR503 | 1 | EXOR502 | 1 | | | | |
| | | AND535 | 0 | AND534 | 0 | AND533 | 0 | AND532 | 0 | | | | |
| | | OR545 | 0 | OR544 | 0 | OR543 | 0 | OR542 | 0 | | | | |

FIG. 6B

| DRZQ1 | 10h | DRZQ15 | 1 | DRZQ14 | 0 | DRZQ13 | 0 | DRZQ12 | 0 | DRZQ11 | 0 | | |
|---|---|---|---|---|---|---|---|---|---|---|---|---|---|
| CORRECTION VALUE=0 | 00h | d5 | 0 | d4 | 0 | d3 | 0 | d2 | 0 | d1 | 0 | | |
| DRZQ1d | 10h | DRZQ1d5 | 1 | DRZQ1d4 | 0 | DRZQ1d3 | 0 | DRZQ1d2 | 0 | DRZQ1d1 | 0 | CARY5d | 0 |
| | | EXOR525 | 1 | EXOR524 | 0 | EXOR523 | 0 | EXOR522 | 0 | EXOR501 | 0 | | |
| | | AND515 | 0 | AND514 | 0 | AND513 | 0 | AND512 | 0 | AND511 | 0 | | |
| | | EXOR505 | 1 | EXOR504 | 0 | EXOR503 | 0 | EXOR502 | 0 | | | | |
| | | AND535 | 0 | AND534 | 0 | AND533 | 0 | AND532 | 0 | | | | |
| | | OR545 | 0 | OR544 | 0 | OR543 | 0 | OR542 | 0 | | | | |

FIG. 6C

| DRZQ1 | 10h | DRZQ15 | 1 | DRZQ14 | 0 | DRZQ13 | 0 | DRZQ12 | 0 | DRZQ11 | 0 | | |
|---|---|---|---|---|---|---|---|---|---|---|---|---|---|
| CORRECTION VALUE=+1 | 01h | d5 | 0 | d4 | 0 | d3 | 0 | d2 | 0 | d1 | 1 | | |
| DRZQ1d | 11h | DRZQ1d5 | 1 | DRZQ1d4 | 0 | DRZQ1d3 | 0 | DRZQ1d2 | 0 | DRZQ1d1 | 0 | CARY5d | 0 |
| | | EXOR525 | 1 | EXOR524 | 0 | EXOR523 | 0 | EXOR522 | 0 | EXOR501 | 1 | | |
| | | AND515 | 0 | AND514 | 0 | AND513 | 0 | AND512 | 0 | AND511 | 0 | | |
| | | EXOR505 | 1 | EXOR504 | 0 | EXOR503 | 0 | EXOR502 | 0 | | | | |
| | | AND535 | 0 | AND534 | 0 | AND533 | 0 | AND532 | 0 | | | | |
| | | OR545 | 0 | OR544 | 0 | OR543 | 0 | OR542 | 0 | | | | |

FIG. 6D

| DRZQ1 | 10h | DRZQ15 | 1 | DRZQ14 | 0 | DRZQ13 | 0 | DRZQ12 | 0 | DRZQ11 | 0 | | |
|---|---|---|---|---|---|---|---|---|---|---|---|---|---|
| CORRECTION VALUE=+2 | 02h | d5 | 0 | d4 | 0 | d3 | 0 | d2 | 1 | d1 | 0 | | |
| DRZQ1d | 12h | DRZQ1d5 | 1 | DRZQ1d4 | 0 | DRZQ1d3 | 0 | DRZQ1d2 | 1 | DRZQ1d1 | 0 | CARY5d | 0 |
| | | EXOR525 | 1 | EXOR524 | 0 | EXOR523 | 0 | EXOR522 | 1 | EXOR501 | 0 | | |
| | | AND515 | 0 | AND514 | 0 | AND513 | 0 | AND512 | 0 | AND511 | 0 | | |
| | | EXOR505 | 1 | EXOR504 | 0 | EXOR503 | 0 | EXOR502 | 1 | | | | |
| | | AND535 | 0 | AND534 | 0 | AND533 | 0 | AND532 | 0 | | | | |
| | | OR545 | 0 | OR544 | 0 | OR543 | 0 | OR542 | 0 | | | | |

FIG. 6E

| DRZQ1 | 1Fh | DRZQ15 | 1 | DRZQ14 | 1 | DRZQ13 | 1 | DRZQ12 | 1 | DRZQ11 | 1 | | |
|---|---|---|---|---|---|---|---|---|---|---|---|---|---|
| CORRECTION VALUE=+1 | 01h | d5 | 0 | d4 | 0 | d3 | 0 | d2 | 0 | d1 | 1 | | |
| DRZQ1d | 00h | DRZQ1d5 | 0 | DRZQ1d4 | 0 | DRZQ1d3 | 0 | DRZQ1d2 | 0 | DRZQ1d1 | 0 | CARY5d | 1 |
| | | EXOR525 | 0 | EXOR524 | 0 | EXOR523 | 0 | EXOR522 | 0 | EXOR501 | 0 | | |
| | | AND515 | 0 | AND514 | 0 | AND513 | 0 | AND512 | 0 | AND511 | 1 | | |
| | | EXOR505 | 1 | EXOR504 | 1 | EXOR503 | 1 | EXOR502 | 1 | | | | |
| | | AND535 | 1 | AND534 | 1 | AND533 | 1 | AND532 | 1 | | | | |
| | | OR545 | 1 | OR544 | 1 | OR543 | 1 | OR542 | 1 | | | | |

EXAMPLE OF DS SETTING CODE
AND CORRECTION VALUE

| DS SETTING CODE | DS SETTING | CODE CORRECTION VALUE |
|---|---|---|
| "00" | RZQ/6 | 0 |
| "01" | RZQ/7 | -1 |

FIG. 7A

EXAMPLE OF ODT SETTING CODE
AND CORRECTION VALUE

| ODT SETTING CODE | ODT SETTING | CODE CORRECTION VALUE |
|---|---|---|
| "010" | RZQ/2 | +2 |
| "001" | RZQ/4 | +1 |
| "011" | RZQ/6 | 0 |

(RZQ:240Ω)

FIG. 7B

IMPEDANCE ADJUSTMENT CIRCUIT WITH CORRECTION CIRCUIT FOR SEMICONDUCTOR DEVICE

This application is based upon and claims the benefit of priority from Japanese patent application No. 2011-152837, filed on Jul. 11, 2011, the disclosure of which is incorporated herein in its entirety by reference.

TECHNICAL FIELD

The present invention relates to a semiconductor device.

BACKGROUND

In recent years, a higher data transfer rate has been required for data transfer between semiconductor devices (for example, data transfer between a CPU and a memory). The amplitude of input/output signal levels is progressively reduced in order to increase a data transfer rate. When input/output signals become smaller, a signal being outputted should have accurate amplitude. Therefore, high accuracy has strictly been required for the impedance of an output buffer.

However, the impedance of an output buffer varies depending upon process conditions of a manufacturing process. When a semiconductor device is actually used, the impedance of an output buffer also varies according to influence from variations of the ambient temperature or variations of a power supply voltage. Therefore, when high accuracy is required for the impedance of an output buffer, an output buffer is provided with a function of adjusting its impedance. Adjustment of the impedance of the output buffer is performed with a circuit provided in a semiconductor device, which is generally referred to as a "calibration circuit." See JP-A 2008-228332 (Patent Literature 1) and JP-A 2007-213786 (Patent Literature 2).

A calibration circuit includes a replica buffer having the same configuration as an output buffer. For a calibration operation, an external resistor is connected to an external terminal for calibration (calibration terminal) in a semiconductor device. A voltage measured at the calibration terminal is compared with a reference voltage. The impedance of the replica buffer is adjusted depending upon the comparison results. The output buffer is configured to reflect the adjustment of the replica buffer, so that the impedance of the output buffer is adjusted to a desired value.

In a semiconductor device disclosed in Patent Literature 1, the output buffer is formed by a plurality of unit buffers. The impedance of each of the unit buffers is adjusted at a preset value with use of a replica buffer provided in a calibration circuit. At the time of data output or on-die termination (ODT), some of unit buffers are selectively activated so as to set the impedance of the output buffer at a set point.

However, when a plurality of buffer unit circuits are activated at the time of data output or ODT, a voltage drop caused by a power supply line, which is connected in common to those unit buffers, varies depending upon the number of unit buffers being activated. Therefore, the impedance of each of the buffer unit circuits being activated at the time of data output or ODT is different from the impedance that was adjusted to a preset value. Thus, the impedance of the output buffer is problematically deviated from a set point.

Patent Literature 2 discloses a semiconductor device having a pre-emphasis function of lowering the impedance of an output buffer for improving the driving capability of the output buffer. This semiconductor device implements the pre-emphasis function without any separate drivers. The semiconductor device adds an adjustment code of offset data to a code for adjusting the impedance of the output buffer for a certain period of time to thereby strengthen the driving capability of the output buffer. However, with the semiconductor device disclosed in Patent Literature 2, the impedance of each of buffer unit circuits being activated is different from the impedance that was adjusted to a preset value. Thus, the impedance of the output buffer is problematically deviated from a set point.

SUMMARY

In one embodiment, there is provided a device comprising:
an output circuit including a plurality of unit buffers, each of the unit buffers having an adjustable impedance;
a controller circuit operable to selectively activate at least one of the unit buffers; and
an impedance adjustment part operable to adjust the impedance of each of the unit buffers in response to a change of the number of the unit buffers that are selectively activated by the controller circuit.

BRIEF DESCRIPTION OF THE DRAWINGS

The above features and advantages of the present invention will be more apparent from the following description of certain preferred embodiments taken in conjunction with the accompanying drawings, in which

FIGS. 6A to 6E are diagrams explanatory of operations of the correction circuit 40.

FIGS. 7A and 7B are tables showing a DS setting code and an ODT setting code.

DESCRIPTION OF EXEMPLARY EMBODIMENTS

The present invention will be now described herein with reference to illustrative exemplary embodiments. Those skilled in the art will recognize that many alternative embodiments can be accomplished using the teachings of the present invention and that the invention is not limited to the exemplary embodiments illustrated for explanatory purposes.

Figure 1:
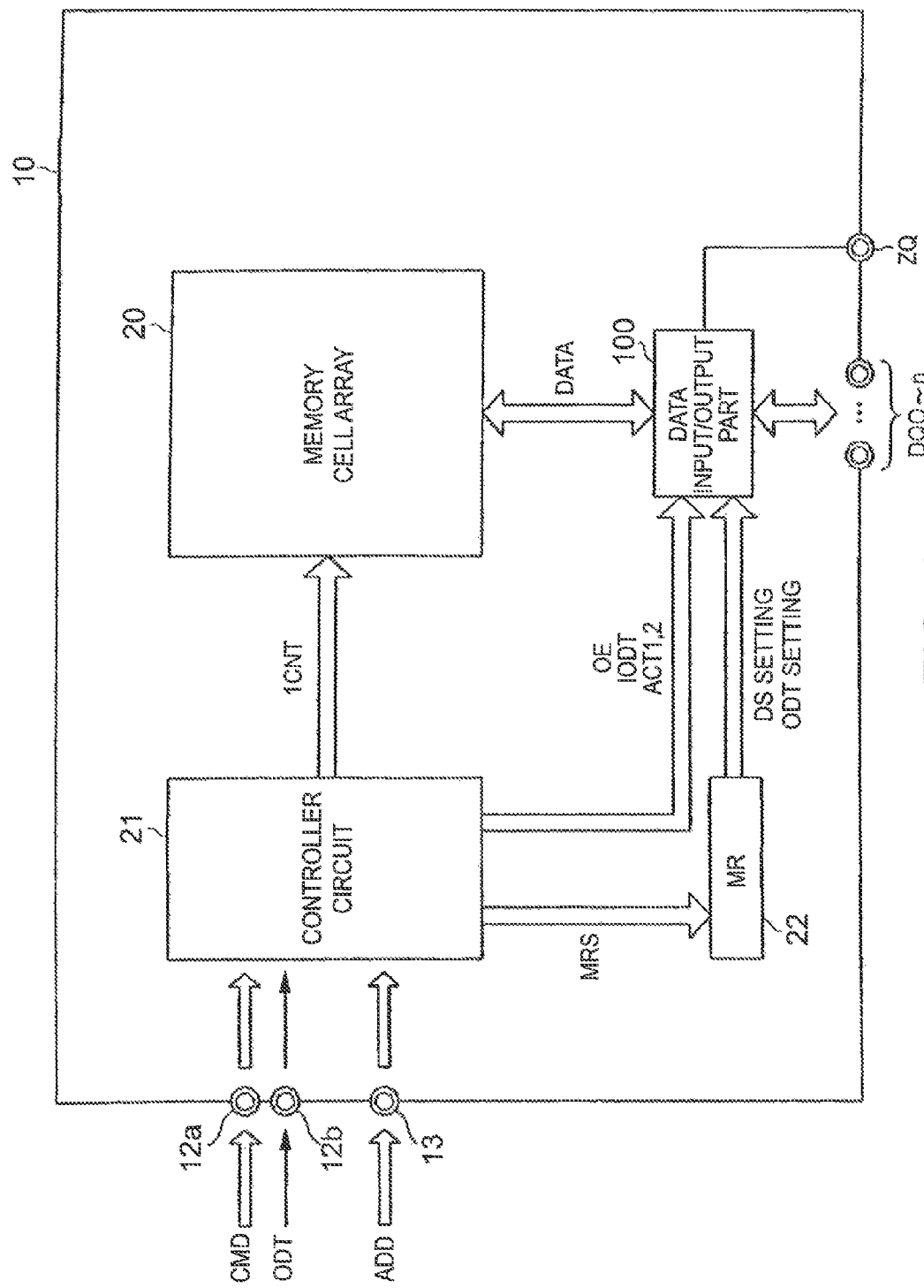
FIG. 1 is a block diagram showing a configuration of a semiconductor device 10 according to an exemplary embodiment of the present invention.

FIG. 1 shows an outline of a semiconductor device 10 to which the present invention is applied. In FIG. 1, the present invention is applied to a synchronous dynamic random access memory (SDRAM) operable in synchronism with, for example, a clock signal supplied from the exterior of the SDRAM. All of circuit blocks illustrated in FIG. 1 are formed on the same semiconductor chip made of monocrystalline silicon. Each of the circuit blocks includes a plurality of transistors such as PMOS transistors (P-type channel MOS transistors) and NMOS transistors (N-type channel MOS transistors). In FIG. 1, double circles denote pads as external terminals provided on the semiconductor chip.

The semiconductor device 10 includes a memory cell array 20, a controller circuit 21, a mode register 22, and a data input/output part 100.

The data input/output part 100, which includes some of the features of the semiconductor device 10 according to an exemplary embodiment of the present invention, has a driver strengthening (DS) function and an on-die termination (ODT) function. The driver strengthening (DS) function is for adjusting the impedance of an output buffer at the time of data output. The semiconductor device 10 enables the DS function by changing the number of unit buffers being activated in the output buffer depending upon a DS setting signal.

The on-die termination (ODT) function is for preventing reflection of signals by enabling the output buffer to function as a terminating resistor when other semiconductor devices perform data transfer on an external bus connected to data terminals DQ. The semiconductor device 10 enables the ODT function by changing the number of the unit buffers being activated in the output buffer depending upon an ODT setting signal.

The details of the DS function and the ODT function will be described later. The summary of the semiconductor device 10 will now be described.

The semiconductor device 10 has external terminals (pads on the semiconductor chip) including a command terminal 12a, an on-die termination terminal 12b, an address terminal 13, data terminals DQ0-DQn, and a calibration terminal ZQ. The semiconductor device 10 also has other external terminals such as a clock terminal and a power supply terminal, which are omitted from the illustration because they do not directly relate to the present invention.

The command terminal 12a collectively denotes terminals supplied with signals such as a row address strobe signal /RAS, a column address strobe signal /CAS, a write enable signal /WE, and a chip select signal /CS. A command signal CMD is formed by a combination of signals inputted to those terminals. The command terminal 12a is connected to the controller circuit 21. In the specification, the signals with a prefix "/" are inverse signals of the corresponding signals or active-low signals.

The on-die termination terminal 12b is supplied with an on-die termination signal ODT. The on-die termination terminal 12b is connected to the controller circuit 21.

The address terminal 13 is supplied with an address signal ADD and connected to the controller circuit 21.

The data terminals DQ are for outputting read data and inputting write data. The data terminals DQ are connected to the data input/output part 100. The calibration terminal ZQ is also connected to the data input/output part 100. A calibration operation, which will be described later, is performed in the data input/output part 100 while an external resistor is connected to the calibration terminal ZQ.

The memory cell array 20 includes a plurality of word lines, a plurality of bit lines, and a plurality of memory cells arranged at intersections of the word lines and the bit lines.

The controller circuit 21 supplies an operation control signal ICNT, which controls an operation of the memory cell array 20, to the memory cell array 20 depending upon the command signal CMD supplied via the command terminal 12a from the exterior of the device and the address signal ADD supplied via the address terminal 13 from the exterior of the device.

The controller circuit 21 controls a reading operation, in which data are read from the memory cells of the memory cell array 20, and a writing operation, in which data are written into the memory cells of the memory cell array 20, by supplying the operation control signal ICNT to the memory cell array 20.

When a mode register set command (MRS command) is supplied as the command signal CMD from the exterior of the device to the controller circuit 21 via the command terminal 12a, the controller circuit 21 supplies the MRS command and a mode register set signal MRS to the mode register 22. The mode register set signal MRS corresponds to a mode setting code supplied as the address signal ADD from the address terminal 13.

When a command indicative of execution of a calibration operation (CAL command) is supplied as the command signal CMD from the exterior of the device to the controller circuit 21 via the command terminal 12a, the controller circuit 21 supplies control signals ACT1 and ACT2 to the data input/output part 100.

Furthermore, the controller circuit 21 controls an active level and an inactive level of an internal on-die termination control signal IODT depending upon the level of the on-die termination signal ODT supplied from the exterior of the device via the on-die termination terminal 12b.

The mode register 22 (MR) supplies a DS setting signal and an ODT setting signal to the data input/output part 100. The DS setting signal and the ODT setting signal are set according to the mode register set signal MRS supplied from the controller circuit 21. In the data input/output part 100, a DS setting operation and an ODT setting operation are performed in accordance with those setting signals. In the DS setting operation, the impedance of unit buffers is adjusted depending upon the number of unit buffers being selectively activated in a data output operation. Unit buffers to be activated are selected from among the unit buffers of the output buffer. Thus, the impedance of the output buffer is adjusted to a desired value by the DS setting operation. In the ODT setting operation, the impedance of the unit buffers is adjusted depending upon the number of unit buffers being selectively activated in an ODT operation for providing a terminating resistor of the semiconductor device 10. Unit buffers to be activated are selected from among the unit buffers of the output buffer. Thus, the impedance of the output buffer is adjusted to a desired value by the ODT setting operation.

During a reading operation, the data input/output part 100 supplies data DATA supplied from the memory cell array 20 to the exterior of the device via the data terminals DQ0-DQn. During a writing operation, the data input/output part 100 supplies data DATA supplied from the exterior of the device via the data terminals DQ0-DQn to the memory cell array 20.

Now the data input/output part 100 will be described below with reference to FIG. 2.

Figure 2:
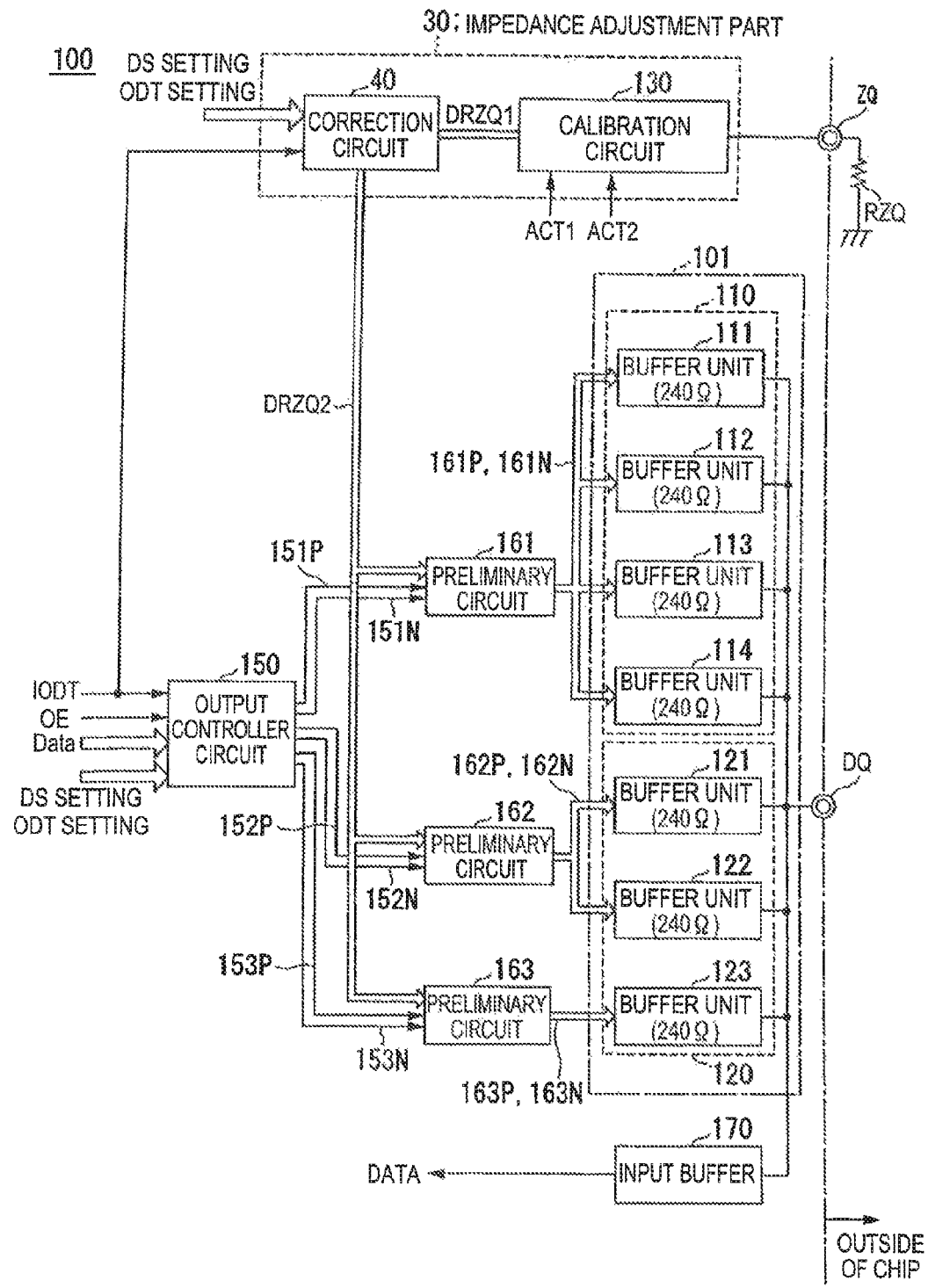
FIG. 2 is a block diagram showing a configuration of a data input/output part 100 in the semiconductor device 10 of FIG. 1.

FIG. 2 is a block diagram showing a configuration of the data input/output part 100. As shown in FIG. 2, the data input/output part 100 includes a first output buffer 110 and a second output buffer 120 connected to the data terminal DQ, an impedance adjustment part 30 connected to the calibration terminal ZQ, and an input buffer 170 connected to the data terminal DQ. The input buffer 170 is a circuit that is activated at the time of data input. The configuration of the input buffer 170 and the details of the data input operation will not be described because they do not directly relate to the present invention. In the specification, the first output buffer 110 and the second output buffer 120 constitute an output buffer 101 of the data input/output part 100.

The first output buffer 110 of the output buffer 101 includes four unit buffers 111-114 connected in parallel. The second output buffer 120 of the output buffer 101 includes three unit buffers 121-123 connected in parallel. The unit buffers 111-114 and 121-123 are circuits for driving the data terminal DQ at the time of a reading operation. As shown in FIG. 2, the unit buffers 111-114 and 121-123 are connected in parallel to the data terminal DQ. Those unit buffers 111-114 and 121-123 have the same circuit configuration. In the present embodiment, for example, each of the unit buffers 111-114 and 121-123 has an impedance of 240Ω (a value after adjustment). The impedance of the unit buffers 111-114 and 121-123 can be adjusted in a calibration operation using impedance control signals DRZQ2 (code) generated by the impedance adjustment part 30.

For example, if all of the unit buffers 111-114 and 121-123 are activated, then the impedance (set point) of the output buffer 101 that is seen by the data terminal DQ is about 34.3Ω (=240Ω/7). Furthermore, if the four unit buffers 111-114 in the first output buffer 110 and the two unit buffers 121 and 122 of the three unit buffers 121-123 in the second output buffer 120 are activated, then the impedance (set point) of the output buffer 101 that is seen by the data terminal DQ is about 40Ω (=240Ω/6).

As described above, however, the resistance of a power supply line connected in common to those unit buffers varies depending upon the number of unit buffers being activated. Therefore, the impedance of each of the buffer unit circuits being activated at the time of data output or ODT is different from a preset value (240Ω in this example) that has been adjusted by a calibration operation. As a result, the impedance of the output buffer 101 is deviated from the set point. In the illustrated example, if all of the unit buffers (seven unit buffers in this example) are selectively activated, a voltage drop is more likely to occur in a power supply line connected in common to the unit buffers as compared to a case where one buffer unit is selectively activated. In a calibration operation, a replica buffer corresponding to one buffer unit is used to set the impedance of each of the unit buffers at 240Ω. Therefore, if seven unit buffers are selectively activated, the impedance of each of the unit buffers becomes higher than the adjusted value of 240Ω. Thus, the impedance of the output buffer 101 is set higher than a set point of about 34.3Ω. In this manner, depending upon the number of unit buffers being selectively activated, the impedance of each of the buffer unit circuits at the time of data output or ODT is different from the adjusted preset value (240Ω in this example). As a result, the impedance of the output buffer 101 is deviated from the set point.

In view of the above, the impedance adjustment part 30 corrects impedance control signals DRZQ1 depending upon the number of the unit buffers being activated and generates impedance control signals DRZQ2. The impedance adjustment part 30 adjusts the impedance of the unit buffers based upon the impedance control signals DRZQ2 and brings the impedance of the output buffer 101 closer to the set point. In the illustrated example, when the seven unit buffers are selectively activated, the impedance of each of the unit buffers is adjusted to be higher than 240Ω. Thus, the impedance of the output buffer 101 is brought closer to the set point of about 34.3Ω.

Accordingly, in a calibration operation, which will be described later, the impedance of the unit buffers 111-114 and 121-123 is adjusted depending upon the number of unit buffers being activated. For example, as shown in FIG. 2, the impedance of the unit buffers 111-114 and 121-123 may be set at 240Ω in some cases where there is no correction. In other cases, the impedance of the unit buffers 111-114 and 121-123 may be set at a value lower or higher than 240Ω by correction. Even if the impedance of the unit buffers is adjusted in the calibration operation by the impedance control signals DRZQ2, correction values for generating impedance control signals DRZQ2 can be updated within a range of predetermined correction values, which will be described later. The impedance of the unit buffers is adjusted without any repeated calibration operations depending upon the number of unit buffers being selectively activated.

The impedance adjustment part 30 is a circuit for generating the impedance control signals DRZQ1 and the impedance control signals DRZQ2.

The impedance adjustment part 30 includes a calibration circuit 130 (impedance adjustment circuit) and a correction circuit 40.

The calibration circuit 130 is a circuit for generating impedance control signals DRZQ1 (first impedance adjustment signal) for adjusting the impedance of each of the unit buffers (unit buffers 111-114 and 121-123) depending upon a resistance of an external resistor connected to the calibration terminal ZQ.

The correction circuit 40 is a circuit for receiving the impedance control signals DRZQ1 from the calibration circuit 130, performing a correction corresponding to the number of buffer unit circuits being activated on the impedance control signals DRZQ1, and generating impedance control signals DRZQ2 (second impedance adjustment signal). The correction circuit 40 receives the DS setting signal or the ODT setting signal from the mode register to acquire the number of buffer unit circuits being activated. The correction circuit 40 performs a correction based upon the setting signal and generates an impedance control signals DRZQ2 (second impedance adjustment signal). Furthermore, the correction circuit 40 supplies the impedance control signals DRZQ2 to the unit buffers (unit buffers 111-114 and 121-123) via preliminary circuits so as to adjust the impedance of each of the unit buffers.

The operation of the unit buffers 111-114 is controlled by operation signals 161P and 161N supplied from the preliminary circuit 161. The operation of the unit buffers 121 and 122 is controlled by operation signals 162P and 162N supplied from the preliminary circuit 162. The operation of the buffer unit 123 is controlled by operation signals 163P and 163N supplied from the preliminary circuit 163.

The unit buffers 111-114 and 121-123 include a plurality of output transistors, which will be described later. The preliminary circuits 161-163 are circuits for specifying which output transistors to be turned on. Operations (on-off control or conduction-nonconduction control) of those output transistors are controlled by the operation signals 161P-163P and the operation signals 161N-163N. As shown in FIG. 2, the preliminary circuits 161-163 are supplied with the common impedance control signals DRZQ2 from the calibration circuit 130. The preliminary circuits 161-163 are supplied individually with selection signals 151P-153P and selection signals 151N-153N from an output controller circuit 150.

The output controller circuit 150 is a circuit for specifying which unit buffers to be activated from among the unit buffers 111-120 and for specifying an output level of the unit buffers at the time of driving the data terminal DQ. The output controller circuit 150 receives the DS setting signal or the ODT setting signal from the mode register and outputs the selection signals 151P-153P and the selection signals 151N-153N to the preliminary circuits 161-163 based upon the setting signal for thereby specifying which unit buffers to be activated.

Furthermore, the output level of the unit buffers to be activated is determined based upon the data DATA supplied from the memory cell array 20 in a reading operation.

The unit buffers 111-114 and 121-123 of the data input/output part 100 illustrated in FIG. 2 have substantially the same configuration as the unit buffer 111 disclosed in FIG. 2 of U.S. Pat. No. 7,215,128 B2, the disclosure of which is incorporated herein by reference. The calibration circuit 130 has substantially the same configuration as the calibration circuit 130 disclosed in FIG. 3 of U.S. Pat. No. 7,215,128 B2. Furthermore, the preliminary circuit 161 has a configuration in which the impedance control signals DRZQP1-DRZQP5 and DRZQN1-DRZQN5 of the pre-stage circuit 161 disclosed in FIG. 6 of U.S. Pat. No. 7,215,128 B2 have been replaced with impedance control signals DRZQP21-DRZQP25 and DRZQN21-DRZQN25. Here, the impedance control signals DRZQP21-DRZQP25 and DRZQN21-DRZQN25 are signals included in the impedance control signals DRZQ2 shown in FIG. 2. Each of the preliminary circuits 162 and 163 has the same configuration as the preliminary circuit 161.

Next, control operations between the preliminary circuits 161-163 and the output controller circuit 150 will be described more specifically.

First, when a command (READ command) that instructs the controller circuit 21 to externally output data DATA from the memory cell array 20 via the data terminal DQ is supplied as the command signal CMD to the controller circuit 21 via the command terminal 12a, the controller circuit 21 supplies a data output enable signal OE to the output controller circuit 150.

When the output controller circuit 150 is supplied with the data output enable signal OE, it controls the preliminary circuits 161-163 to drive the data terminal DQ connected to the output buffer 101 into a high level if the data DATA have a high level of "1" and the internal on-die termination control signal IODT has a low level (inactive level). Furthermore, the output controller circuit 150 controls the preliminary circuits 161-163 to drive the data terminal DQ connected to the output buffer 101 into a low level if the data DATA have a low level of "0" and the internal on-die termination control signal IODT has a low level.

When the data terminal DQ is driven into a high level or a low level, the output controller circuit 150 changes the selection signals 151P-153P and the selection signals 151N-153N, which are to be outputted to the preliminary circuits 161-163, into a high level or a low level depending upon the DS setting signal supplied from the mode register 22.

Specifically, if the DS setting code is "00," the data DATA indicate "1," and the internal on-die termination control signal IODT has a low level when the DS setting signal is inputted from the mode register 22, then the output controller circuit 150 sets the selection signals 151P and 152P at a low level, sets the selection signal 153P at a high level, and sets all of the selection signals 151N-153N at a low level. If some of the OR circuits in the preliminary circuits 161 and 162 are supplied with the impedance control signals DRZQP21-DRZQP25 having a low level as input signals, then those OR circuits output an operation signal having a low level. If some of the OR circuits in the preliminary circuits 161 and 162 are supplied with the impedance control signals DRZQP21-DRZQP25 having a high level as input signals, then those OR circuits output an operation signal having a high level. All of the OR circuits in the preliminary circuit 163 output an operation signal having a high level irrespective of the level of the impedance control signals DRZQP21-DRZQP25. All of the AND circuits in the preliminary circuits 161-163 output an operation signal having a low level irrespective of the level of the impedance control signals DRZQN21-DRZQN25.

Furthermore, if the DS setting code is "01," the data DATA indicate "1," and the internal on-die termination control signal IODT has a low level when the DS setting signal is inputted from the mode register 22, then the output controller circuit 150 sets all of the selection signals 151P-153P at a low level and all of the selection signals 151N-153N at a low level. Thus, if some of the OR circuits in the preliminary circuits 161-163 are supplied with the impedance control signals DRZQP21-DRZQP25 having a low level as input signals, then those OR circuits output an operation signal having a low level. If some of the OR circuits in the preliminary circuits 161-163 are supplied with the impedance control signals DRZQP21-DRZQP25 having a high level as input signals, then those OR circuits output an operation signal having a high level. All of the AND circuits in the preliminary circuits 161-163 output an operation signal having a low level irrespective of the level of the impedance control signals DRZQN21-DRZQN25.

If the DS setting code is "00," the data DATA indicate "0," and the internal on-die termination control signal IODT has a low level when the DS setting signal is inputted from the mode register 22, then the output controller circuit 150 sets all of the selection signals 151P-153P at a high level, the selection signals 151N and 152N at a high level, and the selection signal 153N at a low level. Thus, all of the OR circuits in the preliminary circuits 161-163 output an operation signal having a high level irrespective of the level of the impedance control signals DRZQP21-DRZQP25. If some of the AND circuits in the preliminary circuits 161 and 162 are supplied with the impedance control signals DRZQN21-DRZQN25 having a high level as input signals, then those AND circuits output an operation signal having a high level. If some of the AND circuits in the preliminary circuits 161 and 162 are supplied with the impedance control signals DRZQN21-DRZQN25 having a low level as input signals, then those AND circuits output an operation signal having a low level. All of the AND circuits in the preliminary circuit 163 output an operation signal having a low level irrespective of the level of the impedance control signals DRZQN21-DRZQN25.

If the DS setting code is "01," the data DATA indicate "0," and the internal on-die termination control signal IODT has a low level when the DS setting signal is inputted from the mode register 22, then the output controller circuit 150 sets all of the selection signals 151P-153P at a high level and all of the selection signals 151N-153N at a high level. Thus, all of the OR circuits in the preliminary circuits 161-163 output an operation signal having a high level irrespective of the level of the impedance control signals DRZQP21-DRZQP25. If some of the AND circuits in the preliminary circuits 161-163 are supplied with the impedance control signals DRZQN21-DRZQN25 having a high level as input signals, then those AND circuits output an operation signal having a high level. If some of the AND circuits in the preliminary circuits 161-163 are supplied with the impedance control signals DRZQN21-DRZQN25 having a low level as input signals, then those AND circuits output an operation signal having a low level.

Furthermore, when the on-die termination signal ODT, which instructs the output buffer 101 (output circuit) to function as a terminating resistor, is supplied to the controller circuit 21 via the on-die termination terminal 12b, then the controller circuit 21 inputs the internal on-die termination control signal IODT having an active level (high level) to the output controller circuit 150.

When the output controller circuit 150 is supplied with the internal on-die termination control signal IODT having a high level, it controls the preliminary circuits 161-163 so as to drive the data terminal DQ connected to the output buffer 101 into an intermediate potential between the power source potential VDD and the ground potential GND, e.g., into a potential of VDD/2, irrespective of the level of the data DATA.

Furthermore, when the output controller circuit 150 drives the data terminal DQ into the intermediate potential, it changes the selection signals 151P-153P and the selection signals 151N-153N, which are to be outputted to the preliminary circuits 161-163, into a high level or a low level depending upon the ODT setting signal supplied from the mode register 22.

Specifically, if the ODT setting code is "010" and the internal on-die termination control signal IODT has a high level when the ODT setting signal is inputted from the mode register 22, then the output controller circuit 150 sets the selection signal 152P at a low level, the selection signals 151P and 153P at a high level, the selection signal 152N at a high level, and the selection signals 151N and 153N at a low level.

Thus, if some of the OR circuits in the preliminary circuit 162 are supplied with the impedance control signals DRZQP21-DRZQP25 having a low level as input signals, then those OR circuits output an operation signal having a low level. If some of the OR circuits in the preliminary circuit 162 are supplied with the impedance control signals DRZQP21-DRZQP25 having a high level as input signals, then those OR circuits output an operation signal having a high level.

Furthermore, all of the OR circuits in the preliminary circuits 161 and 163 output an operation signal having a high level irrespective of the level of the impedance control signals DRZQP21-DRZQP25.

If some of the AND circuits in the preliminary circuit 162 are supplied with the impedance control signals DRZQN21-DRZQN25 having a high level as input signals, then those AND circuits output an operation signal having a high level. If some of the AND circuits in the preliminary circuit 162 are supplied with the impedance control signals DRZQN21-DRZQN25 having a low level as input signals, then those AND circuits output an operation signal having a low level.

Furthermore, all of the AND circuits in the preliminary circuits 161 and 163 output an operation signal having a low level irrespective of the level of the impedance control signals DRZQN21-DRZQN25.

If the ODT setting code is "001" and the internal on-die termination control signal IODT has a high level when the ODT setting signal is inputted from the mode register 22, then the output controller circuit 150 sets the selection signal 151P at a low level, the selection signals 152P and 153P at a high level, the selection signal 151N at a high level, and the selection signals 152N and 153N at a low level.

Thus, if some of the OR circuits in the preliminary circuit 161 are supplied with the impedance control signals DRZQP21-DRZQP25 having a low level as input signals, then those OR circuits output an operation signal having a low level. If some of the OR circuits in the preliminary circuit 161 are supplied with the impedance control signals DRZQP21-DRZQP25 having a high level as input signals, then those OR circuits output an operation signal having a high level.

All of the OR circuits in the preliminary circuits 162 and 163 output an operation signal having a high level irrespective of the level of the impedance control signals DRZQP21-DRZQP25.

If some of the AND circuits in the preliminary circuit 161 are supplied with the impedance control signals DRZQN21-DRZQN25 having a high level as input signals, then those AND circuits output an operation signal having a high level. If some of the AND circuits in the preliminary circuit 161 are supplied with the impedance control signals DRZQN21-DRZQN25 having a low level as input signals, then those AND circuits output an operation signal having a low level.

All of the AND circuits in the preliminary circuits 162 and 163 outputs an operation signal having a low level irrespective of the level of the impedance control signals DRZQN21-DRZQN25.

If the ODT setting code is "011" and the internal on-die termination control signal IODT has a high level when the ODT setting signal is inputted from the mode register 22, then the output controller circuit 150 sets the selection signals 151P and 152P at a low level, the selection signal 153P at a high level, the selection signals 151N and 152N at a high level, and the selection signal 153N at a low level.

Thus, if some of the OR circuits in the preliminary circuits 161 and 162 are supplied with the impedance control signals DRZQP21-DRZQP25 having a low level as input signals, then those OR circuits output an operation signal having a low level. If some of the OR circuits in the preliminary circuits 161 and 162 are supplied with the impedance control signals DRZQP21-DRZQP25 having a high level as input signals, then those OR circuits output an operation signal having a high level.

All of the OR circuits in the preliminary circuit 163 output an operation signal having a high level irrespective of the level of the impedance control signals DRZQP21-DRZQP25.

If some of the AND circuits in the preliminary circuits 161 and 162 are supplied with the impedance control signals DRZQN21-DRZQN25 having a high level as input signals, then those AND circuits output an operation signal having a high level. If some of the AND circuits in the preliminary circuits 161 and 162 are supplied with the impedance control signals DRZQN21-DRZQN25 having a low level as input signals, then those AND circuits output an operation signal having a low level.

All of the AND circuits in the preliminary circuit 163 output an operation signal having a low level irrespective of the level of the impedance control signals DRZQN21-DRZQN25.

Figure 3:
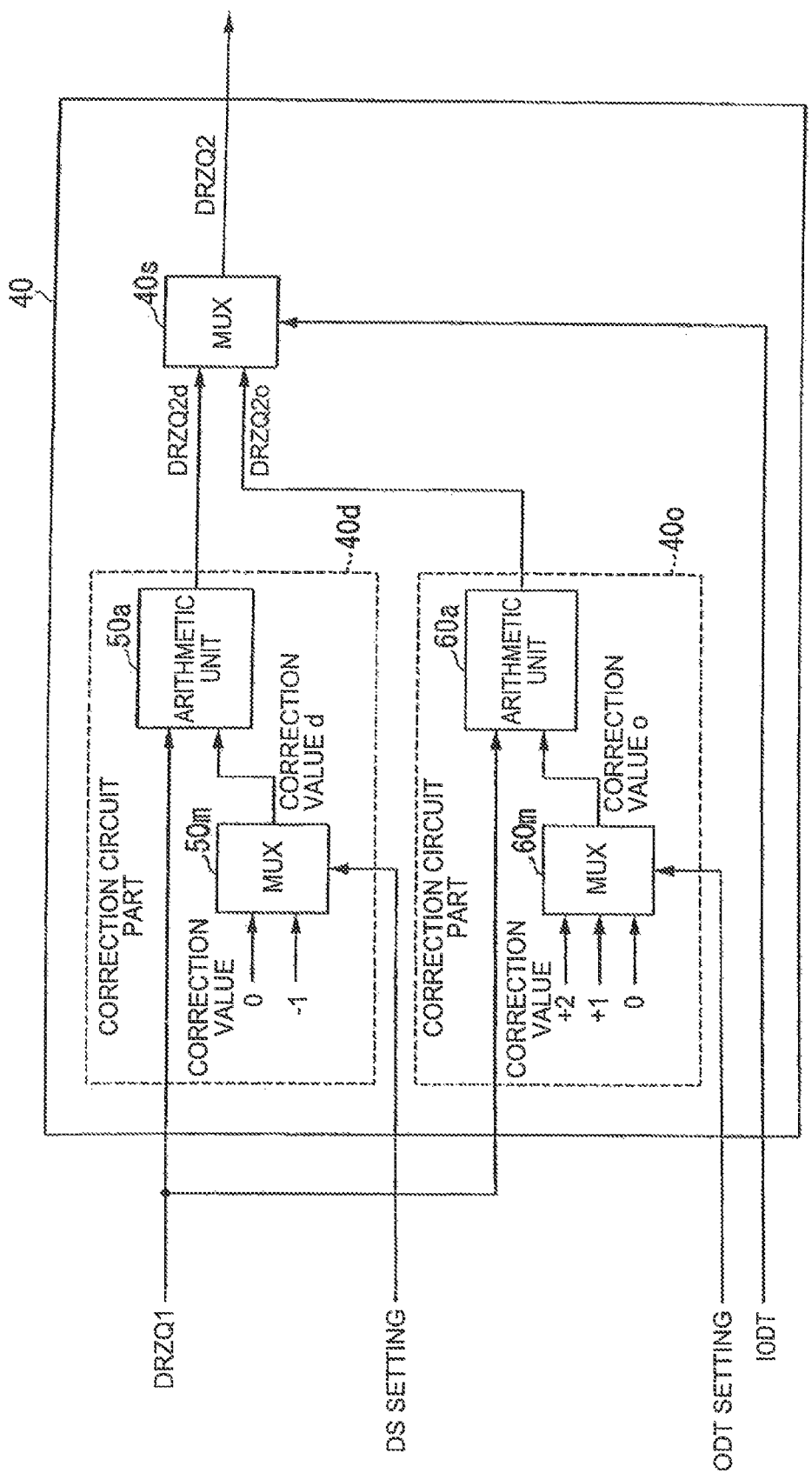
FIG. 3 is a block diagram showing a configuration of a correction circuit 40 in the data input/output part 100 of FIG. 2.
Figure 4:
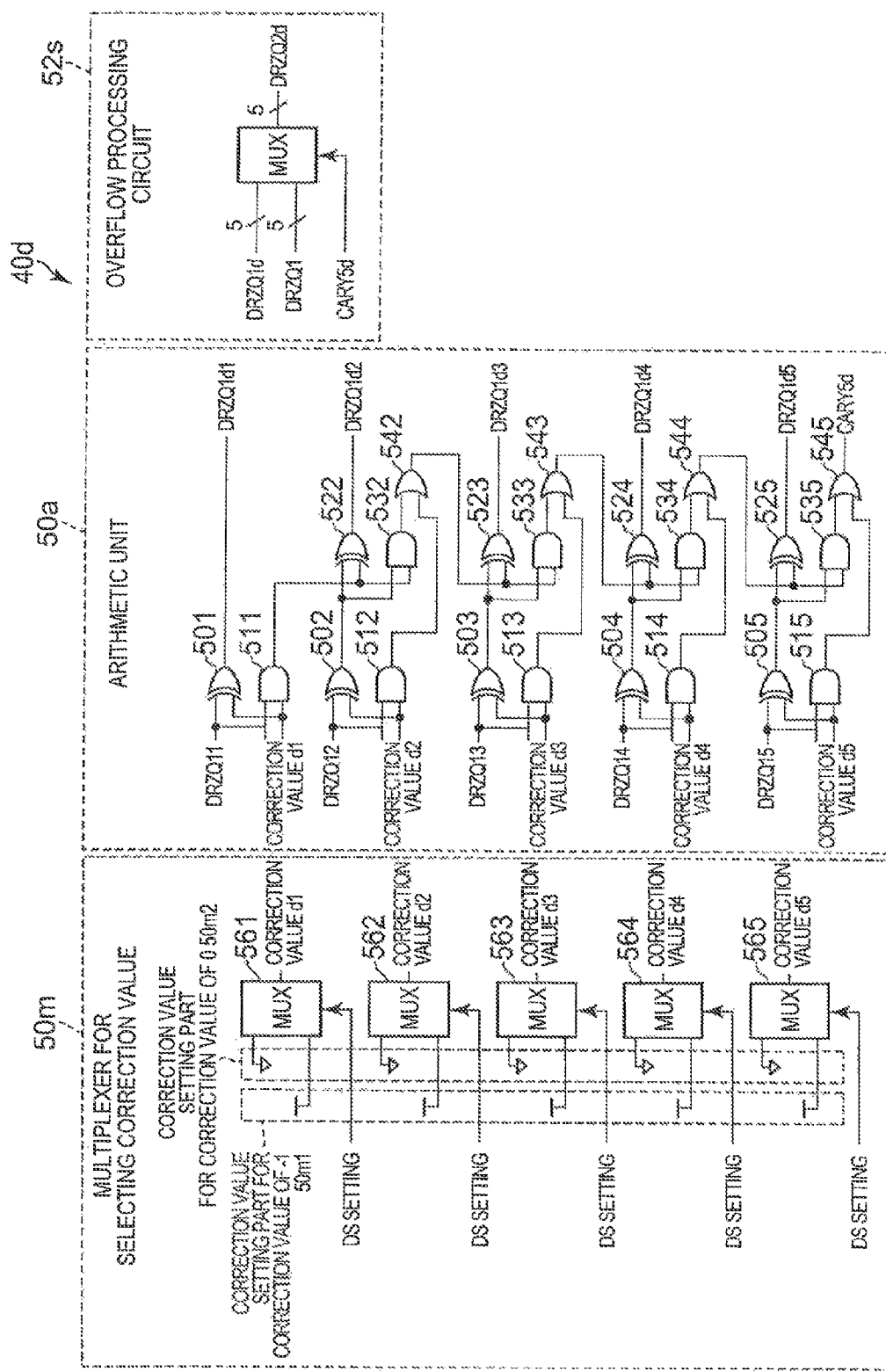
FIG. 4 is a circuit diagram of a correction circuit part 40d in the correction circuit 40 of FIG. 3.
Figure 5:
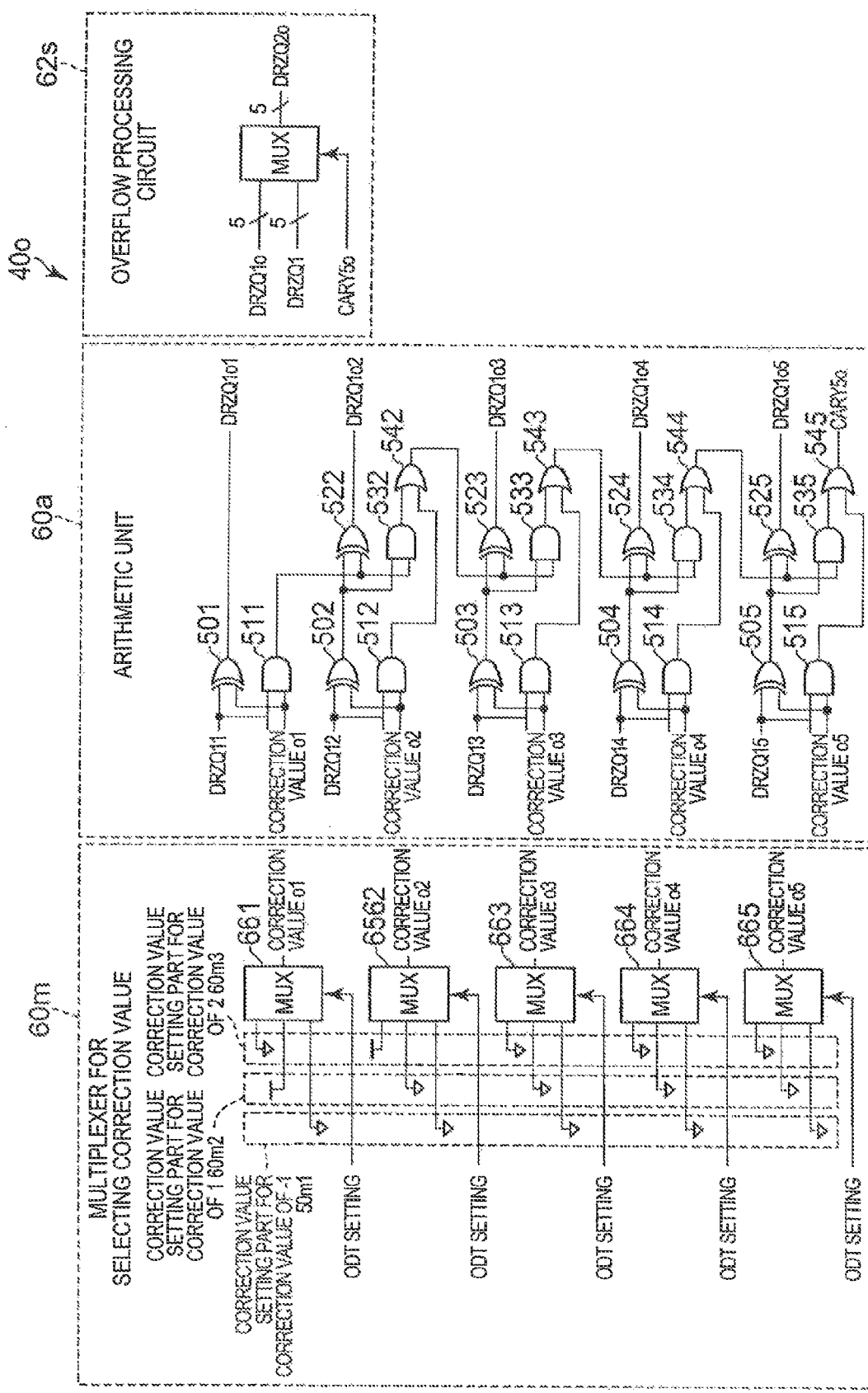
FIG. 5 is a circuit diagram of a correction circuit part 40o in the correction circuit 40 of FIG. 3.

Next, the correction circuit 40 of the impedance adjustment part 30 will be described with reference to FIGS. 3 to 7. FIG. 3 is a block diagram showing a configuration of the correction circuit 40, and FIG. 4 is a circuit diagram of a correction circuit part 40d. FIG. 5 is a circuit diagram of a correction circuit part 400, and FIGS. 6A to 6E are truth tables of primary signals in the correction circuit part 40d. FIGS. 7A and 7B are tables showing the DS setting signal and the ODT setting signal, respectively.

As shown in FIG. 3, the correction circuit 40 includes a correction circuit part 40d, a correction circuit part 400, and a multiplexer 40s. The impedance control signal DRZQP1 (5 bits) and the impedance control signal DRZQN1 (5 bits) are collectively referred to as the impedance control signals DRZQ1. Therefore, one correction circuit 40 is provided for correction of the impedance control signal DRZQP1, and another correction circuit 40 is provided for correction of the impedance control signal DRZQN1. The following description is focused on the correction circuit 40 provided for correction of the impedance control signal DRZQN1. Thus, the impedance control signal DRZQ1 refers to the impedance control signal DRZQN1 (the impedance control signals DRZQN11-DRZQN15). The same correction operation is also performed in the correction circuit 40 provided for correction of the impedance control signal DRZQP1.

The correction circuit part 40d includes a multiplexer 50m and an arithmetic unit 50a. The multiplexer 50m selects one of pre-confirmed correction values depending upon the DS setting signal. The arithmetic unit 50a performs an addition or a subtraction of the correction value d as a selection result on the impedance control signal DRZQ1 for thereby generating an impedance control signal DRZQ2d. The impedance control signal DRZQ1 is a code decided by adjusting the impedance of a replica buffer to 240Ω in a calibration operation.

The correction circuit part 40o includes a multiplexer 60m and an arithmetic unit 60a. The multiplexer 60m selects one of pre-confirmed correction values depending upon the ODT setting signal. The arithmetic unit 60a performs an addition or a subtraction of the correction value o as a selection result on the impedance control signal DRZQ1 for thereby generating an impedance control signal DRZQ2o.

The multiplexer 40s selects one of the impedance control signal DRZQ2d and the impedance control signal DRZQ2o depending upon the level of the internal on-die termination control signal IODT and outputs an impedance control signal DRZQ2 (corrected ZQ code) to the preliminary circuits 161-163.

First, the correction circuit part 40d will be described with reference to FIG. 4.

As shown in FIG. 4, the multiplexer 50m (selection circuit) of the correction circuit part 40d includes a correction value setting part 50m1 for a correction value of −1, a correction value setting part 50m2 for a correction value of 0, and multiplexers 561-565. The correction value setting part 50m1 and the correction value setting part 50m2 constitute a first correction value memory part of the multiplexer 50m. Each of the correction value setting part 50m1 for a correction value of −1 and the correction value setting part 50m2 for a correction value of 0 constitutes a second correction value memory part of the multiplexer 50m.

Each of the correction value setting part 50m1 and the correction value setting part 50m2 includes five nonvolatile elements such as fuses or anti-fuses. Each of the nonvolatile elements is capable of storing data 0 (low level) or data 1 (high level). In the example shown in FIG. 4, the correction value setting part 50m1 stores binary data of "11111" where the nonvolatile element near the multiplexer 561 stores the least significant bit and the nonvolatile element near the multiplexer 565 stores the most significant bit. The data of "11111" indicate five bits arranged rightward in the order from the most significant bit to the least significant bit. In the following description, binary numbers may be represented by, for example, "5'b11111." This binary number "5'b11111" is expressed as "1Fh" in hexadecimal representation with use of hexadecimal digits and "h." Using those expressions in binary and hexadecimal representation, the correction value setting part 50m2 stores data of "5'b00000" (="00h").

The multiplexers 561-565 select 5-bit data stored in the correction value setting part 50m1 or the correction value setting part 50m2 depending upon the DS setting signal inputted from the mode register 22 (MR). Then the multiplexers 561-565 output the selected data as correction values d1-d5 to the subsequent arithmetic unit 50a.

The DS setting signal is supplied from the mode register 22 in the following manner.

When an MRS command is supplied as the command signal CMD to the semiconductor device 10, a mode setting code is supplied as the address signal ADD to the address terminal 13 along with the MRS command. For example, such a mode setting code includes a DS setting code of "A5, A1" corresponding to two bits of addresses A5 and A1. The controller circuit 21 outputs the mode register set signal MRS to the mode register 22 (MR) depending upon the mode setting code. The mode register 22 includes a register that corresponds to the aforementioned addresses, such as a register R51. The mode register 22 stores the DS setting code of "A5, A1" in the register R51 that corresponds to that address.

For example, if a set point for the impedance of the output buffer 101 in the data input/output part 100 is set to be ⅙ of an external resistor RZQ used for a calibration operation as shown in FIG. 7A, then the register R51 stores a DS setting code of "00." Such setting of a set point for the impedance of the output buffer 101 is hereinafter referred to as DS setting.

If a set point for the impedance of the output buffer 101 in the data input/output part 100 is set to be ⅐ of an external resistor RZQ used for a calibration operation as shown in FIG. 7A, then the register R51 stores a DS setting code of "01." Thus, the DS setting code stored in the register R51 can be updated each time the MRS command is supplied as the command signal CMD to the semiconductor device 10. The mode register 22 outputs the DS setting signal to the multiplexers 561-565 depending upon the DS setting code stored in the register R51.

If the DS setting signal is inputted to the multiplexers 561-565 from the mode register 22 in the case where the DS setting code is "00," the multiplexers 561-565 select 5-bit data ("5'b00000"="00h") stored in the correction value setting part 50m2 and output the selected data as correction values d1-d5 to the subsequent arithmetic unit 50a.

If the DS setting signal is inputted to the multiplexers 561-565 from the mode register 22 in the case where the DS setting code is "01," the multiplexers 561-565 select 5-bit data ("5'b11111"="1Fh") stored in the correction value setting part 50m1 and output the selected data as correction values d1-d5 to the subsequent arithmetic unit 50a.

Correction values stored in the correction value setting part 50m1 and the correction value setting part 50m2 are preset by a circuit simulation conducted in circuit design of the semiconductor device 10 (a process of verifying whether the semiconductor device 10 operates properly), depending upon the set point impedance of the output buffer 101. Additionally, after semiconductor devices 10 have been manufactured, the impedance of the output buffer 101 is measured in a product assembled as an evaluation sample. Thus, the correction values are evaluated by examining whether the measured impedance of the output buffer 101 is equal to the set point impedance. If the measured impedance of the output buffer 101 is deviated from the set point impedance, then the correction values are changed into optimum values. The changed correction values are fed back to the semiconductor device 10 being subjected to a wafer process. Since the correction value setting part 50m1 and the correction value setting part 50m2 are formed by nonvolatile memory elements as described above, the changed correction values can be written into the nonvolatile elements and set as fixed values.

As shown in FIG. 4, the arithmetic unit 50a includes EXOR (exclusive OR) circuits 501-505, EXOR (exclusive OR) circuits 522-525, AND (logical product) circuits 511-515, AND (logical product) circuits 532-535, and OR (logical sum) circuits 542-545. The arithmetic unit 50a adds a correction value d to the impedance control signal DRZQ1 or subtracts a correction value d from the impedance control signal DRZQ1 to generate an impedance control signal DRZQ1d.

The EXOR circuit 501 performs an exclusive OR operation on the impedance control signal DRZQ11 and the correction value d1 and outputs the result as an impedance control signal DRZQ1d1.

The AND circuit 511 performs an AND operation on the impedance control signal DRZQ11 and the correction value d1 and outputs the result as its output signal.

The EXOR circuit 502 performs an exclusive OR operation on the impedance control signal DRZQ12 and the correction value d2 and outputs the result as its output signal.

The AND circuit 512 performs an AND operation on the impedance control signal DRZQ12 and the correction value d2 and outputs the result as its output signal.

The EXOR circuit 522 performs an exclusive OR operation on the output signal of the EXOR circuit 502 and the output signal of the AND circuit 511 and outputs an impedance control signal DRZQ1d2.

The AND circuit 532 performs an AND operation on the output signal of the EXOR circuit 502 and the output signal of the AND circuit 511 and outputs the result as its output signal.

The OR circuit 542 performs an OR operation on the output signal of the AND circuit 532 and the output signal of the AND circuit 512 and outputs the result as its output signal.

The EXOR circuit 503 performs an exclusive OR operation on the impedance control signal DRZQ13 and the correction value d3 and outputs the result as its output signal.

The AND circuit 513 performs an AND operation on the impedance control signal DRZQ13 and the correction value d3 and outputs the result as its output signal.

The EXOR circuit 523 performs an exclusive OR operation on the output signal of the EXOR circuit 503 and the output signal of the OR circuit 542 and outputs an impedance control signal DRZQ1d3.

The AND circuit 533 performs an AND operation on the output signal of the EXOR circuit 503 and the output signal of the OR circuit 542 and outputs the result as its output signal.

The OR circuit 543 performs an OR operation on the output signal of the AND circuit 533 and the output signal of the AND circuit 513 and outputs the result as its output signal.

The EXOR circuit 504 performs an exclusive OR operation on the impedance control signal DRZQ14 and the correction value d4 and outputs the result as its output signal.

The AND circuit 514 performs an AND operation on the impedance control signal DRZQ14 and the correction value d4 and outputs the result as its output signal.

The EXOR circuit 524 performs an exclusive OR operation on the output signal of the EXOR circuit 504 and the output signal of the OR circuit 543 and outputs an impedance control signal DRZQ1d4.

The AND circuit 534 performs an AND operation on the output signal of the EXOR circuit 504 and the output signal of the OR circuit 543 and outputs the result as its output signal.

The OR circuit 544 performs an OR operation on the output signal of the AND circuit 534 and the output signal of the AND circuit 514 and outputs the result as its output signal.

The EXOR circuit 505 performs an exclusive OR operation on the impedance control signal DRZQ15 and the correction value d5 and outputs the result as its output signal.

The AND circuit 515 performs an AND operation on the impedance control signal DRZQ15 and the correction value d5 and outputs the result as its output signal.

The EXOR circuit 525 performs an exclusive OR operation on the output signal of the EXOR circuit 505 and the output signal of the OR circuit 544 and outputs an impedance control signal DRZQ1d5.

The AND circuit 535 performs an AND operation on the output signal of the EXOR circuit 505 and the output signal of the OR circuit 544 and outputs the result as its output signal.

The OR circuit 545 performs an OR operation on the output signal of the AND circuit 535 and the output signal of the AND circuit 515 and outputs the result as a carry signal CARY5d.

FIGS. 6A to 6E show levels of the impedance control signals DRZQ1d1-DRZQ1d5 and output levels of the aforementioned circuits when the arithmetic unit 50a generates impedance control signals DRZQ1d1-DRZQ1d5 from the impedance control signals DRZQ11-DRZQ15 and the correction values d1-d5. Those levels are represented by a binary number "0" or "1."

As shown in FIG. 6A, when the impedance control signals DRZQ11-DRZQ15 are represented by "5'b10000" (="10h") and the correction values d1-d5 (the correction value=−1) are represented by "5'b11111" (="1Fh"), then the arithmetic unit 50a outputs "5'b01111" (="0Fh") as impedance control signals DRZQ1d1-DRZQ1d5. When the correction value is a negative number, the two's complement of the negative number is used instead. For example, when the correction value is −2, the two's complement value of "5'b11110" (="1Eh") is used.

As shown in FIG. 6B, when the impedance control signals DRZQ11-DRZQ15 are represented by "5'b10000" (="10h") and the correction values d1-d5 (the correction value=0) are represented by "5'b00000" (="00h"), then the arithmetic unit 50a outputs "5'b10000" (="10h") as impedance control signals DRZQ1d1-DRZQ1d5.

The cases illustrated in FIGS. 6A and 6B correspond to cases where the aforementioned correction value setting part 50m1 and correction value setting part 50m2 are set to have correction values of −1 and 0, respectively.

When the correction value is set to be a negative value as shown in FIG. 6A, the arithmetic unit 50a performs a subtraction on the impedance control signals DRZQ11-DRZQ15 and generates impedance control signals DRZQ1d1-DRZQ1d5. The multiplexer 40s illustrated in FIG. 3 outputs the impedance control signals DRZQ1d1-DRZQ1d5 as impedance control signals DRZQ2 when the internal on-die termination control signal IODT has an inactive level (low level). The impedance control signals DRZQ2 are supplied to the preliminary circuits 161-163, so that the impedance of the corresponding unit buffers is adjusted to be higher than 240Ω. The correction circuit part 40d performs a subtraction on the impedance control signals DRZQN1 as described above and generates impedance control signals DRZQN2, which are supplied to the preliminary circuit 161 so that a pull-down circuit PD (See FIG. 2 of U.S. Pat. No. 7,215,128, incorporated herein by reference) of the corresponding buffer unit is adjusted to have a high impedance. Meanwhile, the correction circuit part 40d performs an addition on the impedance control signals DRZQP1 (the correction values of the correction value setting parts are set at positive values) and generates impedance control signals DRZQP2, which are supplied to the preliminary circuit 161 so that a pull-up circuit PU (See FIG. 2 of U.S. Pat. No. 7,215,128, incorporated herein by reference) of the corresponding buffer unit is adjusted to have a high impedance.

If an addition is performed on the impedance control signals DRZQ1 having the maximum value, or if a subtraction is performed on the impedance control signals DRZQ1 having the minimum value, then the corrected impedance control signals DRZQ1d overflow and become an invalid value. For example, as shown in FIG. 6E, when the impedance control signals DRZQ11-DRZQ15 are represented by "5'b11111" (="1Fh") and the correction values d1-d5 (correction value=+1) are represented by "5'b00001" (="01h"), the arithmetic unit 50a outputs "5'b00000" (="00h") as the impedance control signals DRZQ1*d*1-DRZQ1*d*5. In this case, the impedance of the pull-down circuits PD of the unit buffers becomes infinite (in a high impedance state). In order to prevent the impedance of the pull-down circuits PD of the unit buffers from becoming infinite, some limitations may be imposed on the impedance control signals DRZQ1 such that any one of the transistors 221-225 (See FIG. 2 of U.S. Pat. No. 7,215, 128, incorporated herein by reference) of the pull-down circuit PD is always turned on. In such a case, the impedance of the pull-down circuit PD is largely deviated by the correction even though it does not become infinite. Therefore, in consideration of such an overflow, the correction circuit part 40*d* is provided with a multiplexer 52*s* that receives an input signal of the carry signal CARY5*d*, which is an output of the arithmetic unit 50*a*.

When the carry signal CARY5*d* has a value of "1" (high level), the multiplexer 52*s* outputs the impedance control signals DRZQ1 to be corrected, not the corrected impedance control signals DRZQ1*d*, as the impedance control signals DRZQ2*d*, to the multiplexer 40*s*. When the carry signal CARY5*d* has a value of "0" (low level), the multiplexer 52*s* outputs the corrected impedance control signals DRZQ1*d* as the impedance control signals DRZQ2*d* to the multiplexer 40*s*.

Next, the correction circuit part 40*o* will be described with reference to FIG. 5.

As shown in FIG. 5, the multiplexer 60*m* (selection circuit) of the correction circuit part 40*o* includes a correction value setting part 60*m*1 for a correction value of 0, a correction value setting part 60*m*2 for a correction value of 1, a correction value setting part 60*m*3 for a correction value of 2, and multiplexers 661-665. The correction value setting part 60*m*1, the correction value setting part 60*m*2, and the correction value setting part 60*m*3 constitute a first correction value memory part of the multiplexer 60*m*. Each of the correction value setting part 60*m*1 for a correction value of 0, the correction value setting part 60*m*2 for a correction value of 1, and the correction value setting part 60*m*3 for a correction value of 2 constitutes a second correction value memory part of the multiplexer 60*m*.

In the example shown in FIG. 5, the correction value setting part 60*m*1 stores "5'b00000" (="00h"). The correction value setting part 60*m*2 stores "5'b00001" (="01h"). The correction value setting part 60*m*3 stores "5'b00010" (="02h").

The multiplexers 661-665 select 5-bit data stored in any of the correction value setting parts including the correction value setting part 60*m*1, the correction value setting part 60*m*2, and the correction value setting part 60*m*3 depending upon the ODT setting signal inputted from the mode register 22 (MR). Then the multiplexers 661-665 output the selected data as correction values o1-o5 to the subsequent arithmetic unit 60*a*.

The ODT setting signal is supplied from the mode register 22 as with the aforementioned DS setting signal. When an MRS command is supplied as the command signal CMD to the semiconductor device 10, the controller circuit 21 outputs a mode register set signal MRS to the mode register 22 (MR) depending upon a mode setting code that has been supplied as the address signal ADD to the address terminal 13 along with the MRS command. For example, such a mode setting code includes an ODT setting code of "A9, A6, A2" corresponding to three bits of addresses A9, A6, and A2. The mode register 22 includes a register that corresponds to the aforementioned addresses, such as a register R962. The mode register 22 stores the ODT setting code "A9, A6, A2" in the register R962 that corresponds to that address.

For example, if a set point for the impedance of the output buffer 101 used as a terminating resistor in the data input/output part 100 is set to be ½ of an external resistor RZQ used for a calibration operation as shown in FIG. 7B, then the register R962 stores an ODT setting code of "010." Such setting of a set point for the impedance of the output buffer 101 is hereinafter referred to as ODT setting.

If a set point for the impedance of the output buffer 101 used as a terminating resistor in the data input/output part 100 is set to be ¼ of an external resistor RZQ used for a calibration operation as shown in FIG. 7B, then the register R962 stores an ODT setting code of "001."

If a set point for the impedance of the output buffer 101 used as a terminating resistor in the data input/output part 100 is set to be ⅙ of an external resistor RZQ used for a calibration operation as shown in FIG. 7B, then the register R962 stores an ODT setting code of "011."

Thus, the ODT setting code stored in the register R962 can be updated each time the MRS command is supplied as the command signal CMD to the semiconductor device 10. Since the terminal used for the ODT setting code is different from the address terminal 13 used for the DS coding code, a DS code and an ODT code can simultaneously be set in the mode register 22.

The mode register 22 outputs an ODT setting signal to the multiplexers 661-665 depending upon the ODT setting code stored in the register R962.

If the ODT setting signal is inputted to the multiplexers 661-665 from the mode register 22 in the case where the ODT setting code is "011," the multiplexers 661-665 select 5-bit data ("5'b00000"="00h") stored in the correction value setting part 60*m*1 and output the selected data as correction values o1-o5 to the subsequent arithmetic unit 60*a*.

If the ODT setting signal is inputted to the multiplexers 661-665 from the mode register 22 in the case where the ODT setting code is "001," the multiplexers 661-665 select 5-bit data ("5'b00001"="01h") stored in the correction value setting part 60*m*2 and output the selected data as correction values o1-o5 to the subsequent arithmetic unit 60*a*.

If the ODT setting signal is inputted to the multiplexers 661-665 from the mode register 22 in the case where the ODT setting code is "010," the multiplexers 661-665 select 5-bit data ("5'b00010"="02h") stored in the correction value setting part 60*m*3 and output the selected data as correction values o1-o5 to the subsequent arithmetic unit 60*a*.

As with the correction values stored in the correction value setting part 50*m*1 and the correction value setting part 50*m*2, correction values stored in the correction value setting part 60*m*1, the correction value setting part 60*m*2, and the correction value setting part 60*m*3 have been changed into optimum values through a design process and an evaluation process, written into the nonvolatile elements, and set as fixed values.

As shown in FIG. 5, the arithmetic unit 60*a* has the same configuration as the arithmetic unit 50*a* shown in FIG. 4 except that input/output signals have different names. In FIG. 5, therefore, the corresponding components are denoted by the same reference numerals as in FIG. 4, and the explanation of such circuits and their connection is omitted herein. The correction values o1-o5 correspond to the correction values d1-d5 of FIG. 4, respectively. The impedance control signals DRZQ1*o*1-DRZQ1*o*5 correspond to the impedance control signals DRZQ1*d*1-DRZQ1*d*5 of FIG. 4. The carry signal CARY5*o* corresponds to the carry signal CARY5*d* of FIG. 4.

The level of the impedance control signals DRZQ1*o*1-DRZQ1*o*5 and the level of outputs from the respective circuits at the time when the arithmetic unit 60*a* performs an addition or a subtraction of the correction values o1-o5 on the impedance control signals DRZQ11-DRZQ15 so as to generate the impedance control signals DRZQ1o1-DRZQ1o5 can be obtained by reading the correction values d1-d5 as the correction values o1-o5 and the impedance control signals DRZQ1d1-DRZQ1d5 as the impedance control signals DRZQ1o1-DRZQ1o5, respectively, in FIGS. 6A to 6E.

As shown in FIG. 6B, when the impedance control signals DRZQ11-DRZQ15 are represented by "5'b10000" (="10h") and the correction values o1-o5 (correction value=0) are represented by "5'b00000" (="00h"), the arithmetic unit 60a outputs "5'b10000" (="10h") as the impedance control signals DRZQ1o1-DRZQ1o5.

As shown in FIG. 6C, when the impedance control signals DRZQ11-DRZQ15 are represented by "5'b10000" (="10h") and the correction values o1-o5 (correction value=1) are represented by "5'b00001" (="01h"), the arithmetic unit 60a outputs "5'b10001" (="11h") as the impedance control signals DRZQ1o1-DRZQ1o5.

As shown in FIG. 6D, when the impedance control signals DRZQ11-DRZQ15 are represented by "5'b10000" (="10h") and the correction values o1-o5 (correction value=2) are represented by "5'b00010" (="02h"), the arithmetic unit 60a outputs "5'b10010" (="12h") as the impedance control signals DRZQ1o1-DRZQ1o5.

The cases illustrated in FIGS. 6B to 6D correspond to cases where the aforementioned correction value setting part 60m1, correction value setting part 60m2, and correction value setting part 60m3 are set to have correction values of 0, 1, and 2, respectively.

When the correction value is set to be a positive value as shown in FIGS. 6C and 6D, the arithmetic unit 60a performs an addition on the impedance control signals DRZQ11-DRZQ15 and generates impedance control signals DRZQ1o1-DRZQ1o5. The multiplexer 40s illustrated in FIG. 3 outputs the impedance control signals DRZQ1o1-DRZQ1o5 as impedance control signals DRZQ2 if the internal on-die termination control signal IODT has an active level (high level). The impedance control signals DRZQ2 are supplied to the preliminary circuits 161-163, so that the impedance of the corresponding unit buffers is adjusted to be lower than 240Ω The correction circuit part 40d performs an addition on the impedance control signals DRZQN1 as described above and generates impedance control signals DRZQN2, which are supplied to the preliminary circuit 161 so that a pull-down circuit PD (See FIG. 2 of U.S. Pat. No. 7,215,128, incorporated herein by reference) of the corresponding buffer unit is adjusted to have a low impedance. Meanwhile, the correction circuit part 40o performs a subtraction on the impedance control signals DRZQP1 (the correction values of the correction value setting parts are set at negative values) and generates impedance control signals DRZQP2, which are supplied to the preliminary circuit 161 so that a pull-up circuit PU (See FIG. 2 of U.S. Pat. No. 1,215,128, incorporated herein by reference) of the corresponding buffer unit is adjusted to have a low impedance.

As with the multiplexer 52s, when the carry signal CARY5o has a value of "1" (high level), the multiplexer 62s outputs the impedance control signals DRZQ1 to be corrected, not the corrected impedance control signals DRZQ1o, as the impedance control signals DRZQ2o, to the multiplexer 40s. When the carry signal CARY5o has a value of "0" (low level), the multiplexer 62s outputs the corrected impedance control signals DRZQ1o as the impedance control signals DRZQ2o to the multiplexer 40s.

The data input/output part 100 according to the present embodiment has the aforementioned configuration. A calibration operation, a data output operation (data output operation of DS setting), and an ODT operation of the data input/output part 100 according to the present embodiment will now be described in the order named.

[Calibration Operation]

As described above, a calibration operation is performed to adjust the impedance of the output buffer 101. Specifically, a calibration operation is performed not only to modify variations of the impedance of the output buffer 101 that are caused by process conditions of a manufacturing process, but also to modify variations of the impedance of the output buffer 10 that are caused by a change of the ambient temperature and a change of a power supply voltage. Therefore, one calibration operation performed during an initialization such as a power-on process or a reset process is not sufficient if a high accuracy is required. It is preferable to perform calibration operations periodically during an actual operation. The data input/output part 100 of the present embodiment is particularly effective in a case where calibration operations are performed periodically during an actual operation.

In order to perform a calibration operation, an external resistor RZQ should be connected to the calibration terminal ZQ (see FIG. 2). The external resistor RZQ should have the same impedance as the impedance of a targeted one of the unit buffers 111-114 and 121-123, which is equal to the impedance of the replica buffer. Therefore, an external resistor RZQ of 240Ω is used in the present embodiment.

It is assumed that the semiconductor device 10 is supplied with a mode register command (MRS command) as the command signal CMD before the semiconductor device 10 is supplied with a calibration command (CAL command), which commands a calibration operation, as the command signal CMD. Furthermore, it is assumed that a mode setting code (a DS setting code of "A5, A1" or an ODT setting code of "A9, A6, A2") is supplied as the address signal ADD to the address terminal 13 of the semiconductor device 10 along with the MRS command. It is assumed that the register R51 stores a DS setting code of "00." It is also assumed that the on-die termination signal ODT supplied from the on-die termination terminal 12b has a low level and that the controller circuit 21 maintains the internal on-die termination control signal IODT at an inactive level (low level).

For example, a calibration operation is performed in the same manner as described in the flow chart disclosed in FIG. 7 of U.S. Pat. No. 7,215,128 B2, the disclosure of which is incorporated herein by reference.

If a DS setting code of "01" is provided along with the MRS command before a CAL command, which commands a calibration operation, is supplied, the register R51 of the mode register 22 stores the DS setting code of "01." In this case, the multiplexers 561-565 select and output data "5'b11111" (="1Fh") stored in the correction value setting part 50m1. The arithmetic unit 50a performs an addition or a subtraction of a correction value d inputted from the correction value setting part 50m1 on the inputted impedance control signals DRZQ1 and outputs impedance control signals DRZQ1d. In this case, since the correction value d is −1, the correction circuit 40 performs a subtraction on the impedance control signals DRZQ1 and outputs impedance control signals DRZQ2.

The determined impedance control signals DRZQ2 are supplied in common to the preliminary circuits 161-163. The unit buffers 111-114 and 121-123, which are controlled by the preliminary circuits 161-163, can operate with an impedance higher than 240Ω (240Ω+α where α>0).

Next, a data output operation and an ODT operation will be described with reference to FIG. 8.

Figure 8:
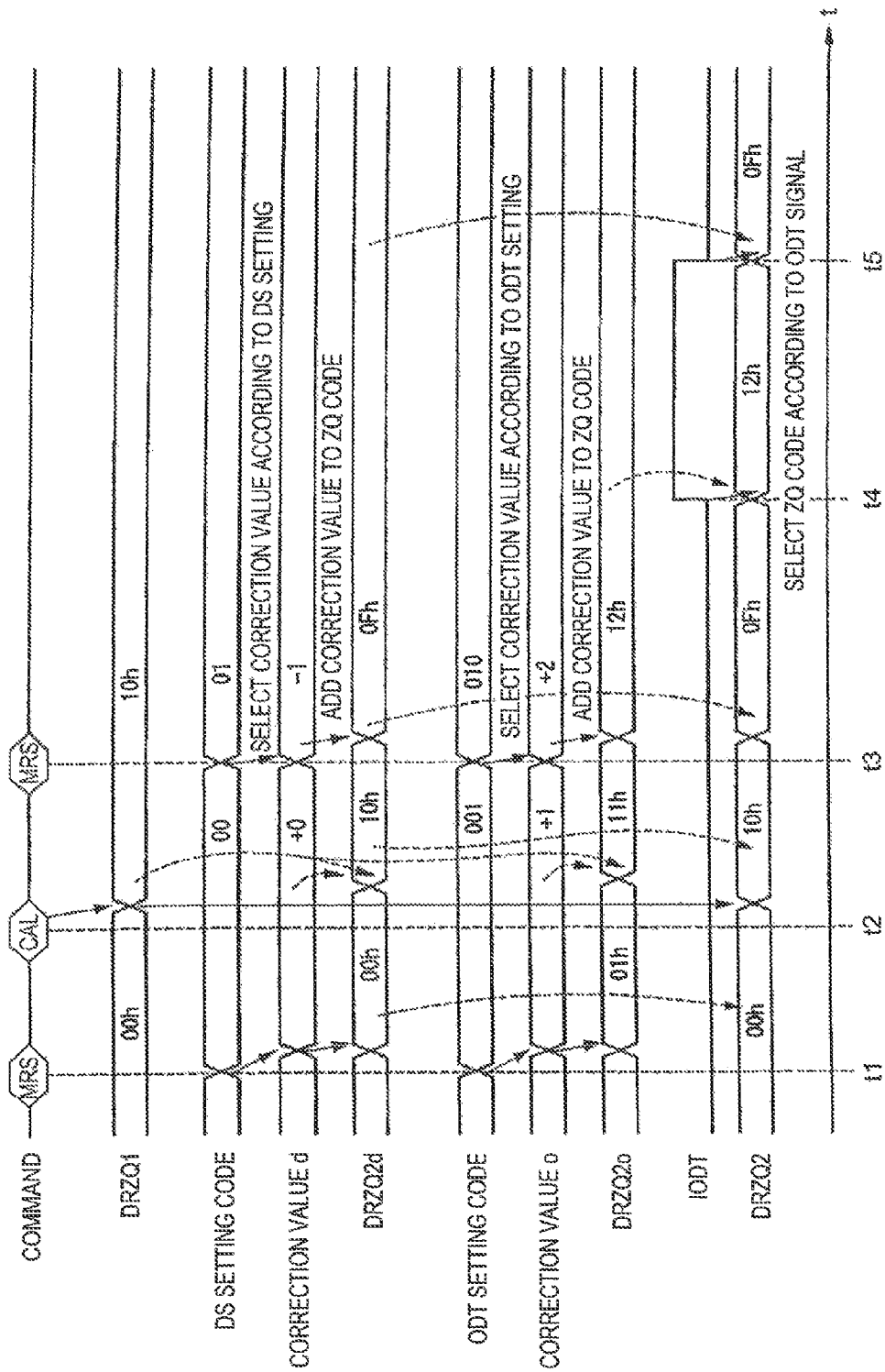
FIG. 8 is a timing chart of an operation of the semiconductor device 10.

The level of the impedance control signal DRZQ1 illustrated in FIG. 8 represents the level of the impedance control signals DRZQN11-DRZQN11, and the level of the impedance control signal DRZQ2 represents the level of the impedance control signals DRZQN21-DRZQN21. The level of the impedance control signals DRZQP11-DRZQP11 is set to have a level that is logically inverse to the impedance control signals DRZQN11-DRZQN11 during a calibration operation. The level of the impedance control signals DRZQP21-DRZQP21 is set to have a level that is logically inverse to the impedance control signals DRZQN21-DRZQN21 during a correction operation of the correction circuit 40. For example, when the level of the impedance control signals DRZQN21-DRZQN25 is represented by "5'b10000" (="10h"), the level of the impedance control signals DRZQP21-DRZQP25 is represented by "5'b01111" (="0Fh").

The data output operation and the ODT operation should be performed after the aforementioned calibration operation was performed at least once. With those operations, the semiconductor device 10 can operate with correct impedance.

For example, an MRS command is supplied as the command signal CMD from a memory controller to the command terminal 12a of the semiconductor device 10 at time t1. At that time, a DS setting code of "00" and an ODT setting code of "001" are supplied as the address signal ADD to the address terminal 13 of the semiconductor device 10. The memory controller maintains the on-die termination terminal 12b at a low level.

Thus, the controller circuit 21 outputs a mode register signal MRS to the mode register 22. The controller circuit 21 maintains the internal on-die termination control signal IODT at an inactive level (low level).

The mode register 22 outputs the DS setting signal and the ODT setting signal to the correction circuit 40. When the DS setting signal is inputted to the correction circuit 40 from the mode register 22, the multiplexer 50m of the correction circuit 40 selects 5-bit data ("5'b00000"="00h") stored in the correction value setting part 50m2 because the DS setting code is "00." The multiplexer 50m outputs the selected data as correction values d1-d5 (correction value d=0) to the arithmetic unit 50a.

Furthermore, when the ODT setting signal is inputted to the correction circuit 40 from the mode register 22, the multiplexer 60m of the correction circuit 40 selects 5-bit data ("5'b00001"="01h") stored in the correction value setting part 60m2 because the ODT setting code is "001." The multiplexer 60m outputs the selected data as correction values o1-o5 (correction value o=+1) to the arithmetic unit 60a.

At that time, the level of the impedance control signal DRZQ1 (impedance control signals DRZQN11-DRZQN15) is zero ("5'b00000"="00h"), which is an initial value of a counter 135 because a CAL command has not been supplied.

The arithmetic unit 50a of the correction circuit 40 adds the correction value d (=0) to the impedance control signal DRZQ1 and outputs "5'b00000" (="00h") as an impedance control signal DRZQ2d.

The arithmetic unit 60a of the correction circuit 40 adds the correction value o (=1) to the impedance control signal DRZQ1 and outputs "5'b00001" (="01h") as an impedance control signal DRZQ2o.

Since the internal on-die termination control signal IODT has a low level at that time, the multiplexer 40s of the correction circuit 40 selects the impedance control signal DRZQ2d and outputs an impedance control signal DRZQ2. The impedance control signal DRZQ2 has a level of "5'b00000" (="00h").

The output controller circuit 150 sets all of the selection signals 151P-153P at a high level and all of the selection signals 151N-153N at a low level because it has not been instructed to perform a data output operation or an ODT operation. Therefore, all of the operation signals 161P-163P, which are outputs of the preliminary circuits 161-163, have a high level, and all of the operation signals 161N-163N, which are outputs of the preliminary circuits 161-163, have a low level. Thus, all of transistors in the seven unit buffers of the output buffer 101 are turned off (brought out of conduction). Accordingly, the output buffer 101 becomes an inactive state irrespective of the level of the impedance control signal DRZQ2.

If a CAL command is supplied as the command signal CMD from the memory controller to the command terminal 12a of the semiconductor device 10 at time t2, control signals ACT1 and ACT2 are inputted to the calibration circuit 130 from the controller circuit 21 so that the aforementioned calibration operation is performed. Thus, the impedance of the pull-up circuits 131 and 132 (See FIG. 3 of U.S. Pat. No. 7,215,128, incorporated herein by reference) and the pull-down circuit 133 (See FIG. 3 of U.S. Pat. No. 7,215,128, incorporated herein by reference) is adjusted to 240Ω, and the level of the impedance control signal DRZQ1 is determined as "5'b10000"="10h."

Since the register of the mode register 22 has not been updated, the multiplexer 50m of the correction circuit 40 is supplied with the DS setting signal generated at time t1. Since the DS setting code is "00," the multiplexer 50m selects 5-bit data ("5'b00000"="00h") stored in the correction value setting part 50m2 and outputs the selected data as correction values d1-d5 (correction value d=0) to the arithmetic unit 50a.

Since the register of the mode register 22 has not been updated, the multiplexer 60m of the correction circuit 40 is supplied with the ODT setting signal generated at time t1. Since the ODT setting code is "001," the multiplexer 60m selects 5-bit data ("5'b00001"="01h") stored in the correction value setting part 60m2 and outputs the selected data as correction values o1-o5 (correction value o=+1) to the arithmetic unit 60a.

The arithmetic unit 50a of the correction circuit 40 adds the correction value d (=0) to the impedance control signal DRZQ1 to generate an impedance control signal DRZQ2d and outputs the impedance control signal DRZQ2d of "5'b10000" (="10h").

The arithmetic unit 60a of the correction circuit 40 adds the correction value o (=1) to the impedance control signal DRZQ1 to generate an impedance control signal DRZQ2o and outputs the impedance control signal DRZQ2o of "5'b10001" (="11h").

Since the internal on-die termination control signal IODT has a low level at that time, the multiplexer 40s of the correction circuit 40 selects the impedance control signal DRZQ2d and outputs an impedance control signal DRZQ2. The impedance control signal DRZQ2 has a level of "5'b10000" (="10h").

When a command for outputting data DATA from the memory cell array 20 to the exterior of the semiconductor device 10 via the data terminal DQ (READ command) is supplied as the command signal CMD to the controller circuit 21 via the command terminal 12a, the controller circuit 21 supplies a data output enable signal OE to the output controller circuit 150.

When the output controller circuit 150 is supplied with the data output enable signal OE, it controls the preliminary circuits 161-163 to drive the data terminal DQ connected to the output buffer 101 into a high level if the data DATA have a high level of "1" and the internal on-die termination control signal IODT has a low level. The output controller circuit 150 controls the preliminary circuits 161-163 to drive the data terminal DQ connected to the output buffer 101 into a low level if the data DATA have a low level of "0" and the internal on-die termination control signal IODT has a low level.

When the data terminal DQ is driven into a high level or a low level, the output controller circuit 150 changes the selection signals 151P-153P and the selection signals 151N-153N, which are to be outputted to the preliminary circuits 161-163, into a high level or a low level depending upon the DS setting signal supplied from the mode register 22.

When the DS setting signal is inputted to the output controller circuit 150 from the mode register 22, the DS setting code is "00," the data DATA indicate "1," and the internal on-die termination control signal IODT has a low level. Therefore, when the data terminal DQ is to be driven into a high level, the output controller circuit 150 sets the selection signals 151P and 152P at a low level, the selection signal 153P at a high level, and all of the selection signals 151N-153N at a low level. Thus, if some of the OR circuits in the preliminary circuits 161 and 162 are supplied with the impedance control signals DRZQP21-DRZQP25 having a low level as input signals, then those OR circuits output an operation signal having a low level. If some of the OR circuits in the preliminary circuits 161 and 162 are supplied with the impedance control signals DRZQP21-DRZQP25 having a high level as input signals, then those OR circuits output an operation signal having a high level.

At that time, as shown in FIG. 8, the impedance control signals DRZQ21-DRZQ25 have a level of "5'b10000" (="10h"). Therefore, the impedance control signals DRZQP21-DRZQP25 have a level of "5'b01111" (="0Fh"), which is logically inverse to the impedance control signals DRZQ21-DRZQ25. Accordingly, the operation signal 161P5 of the operation signals 161P has a low level, and the operation signals 161P1-161P4 of the operation signals 161P have a high level. The operation signal 162P5 of the operation signals 162P has a low level, and the operation signals 162P1-162P4 of the operation signals 162P have a high level.

All of the OR circuits in the preliminary circuit 163 output an operation signal having a high level irrespective of the level of the impedance control signals DRZQP21-DRZQP25. Therefore, all of operation signals 163P1-163P5 of the operation signals 163P have a high level.

All of the AND circuits in the preliminary circuits 161-163 output an operation signal having a low level irrespective of the level of the impedance control signals DRZQN21-DRZQN25. Therefore, all of the operation signals 161N-163N have a low level.

Thus, the pull-up circuits PU (See FIG. 2 of U.S. Pat. No. 7,215,128, incorporated herein by reference) in the unit buffers 111-114, 121, and 122 are turned on at 240Ω, which is the same impedance as the pull-up circuits 131 and 132 in the calibration circuit 130 (See FIG. 3 of U.S. Pat. No. 7,215,128, incorporated herein by reference). All of the pull-up circuit PU in the buffer unit 123 and the pull-down circuits PD (See FIG. 2 of U.S. Pat. No. 7,215,128, incorporated herein by reference) in the unit buffers 111-114 and 121-123 are turned off. In other words, since all of the pull-up circuits in the six unit buffers 111-114, 121, and 122 are turned on accurately at 240Ω, the data terminal DQ is driven into a high level (VDD potential) more accurately at an impedance of 40Ω (=240Ω/6) by the output buffer 101.

Meanwhile, when the DS setting signal is inputted to the output controller circuit 150 from the mode register 22, the DS setting code is "00," the data DATA indicate "0," and the internal on-die termination control signal IODT has a low level. Therefore, when the data terminal DQ is to be driven into a low level, the output controller circuit 150 sets the selection signals 151P-153P at a high level, the selection signals 151N and 152N at a high level, and the selection signal 153N at a low level. Thus, all of the OR circuits in the preliminary circuits 161-163 output an operation signal having a high level irrespective of the level of the impedance control signals DRZQP21-DRZQP25. Therefore, all of the operation signals 161P-163P become a high level.

If some of the AND circuits in the preliminary circuits 161 and 162 are supplied with the impedance control signals DRZQN21-DRZQN25 having a high level as input signals, then those AND circuits output an operation signal having a high level. If some of the AND circuits in the preliminary circuits 161 and 162 are supplied with the impedance control signals DRZQN21-DRZQN25 having a low level as input signals, then those AND circuits output an operation signal having a low level.

At that time, as shown in FIG. 8, the impedance control signals DRZQN21-DRZQN25 have a level of "5'b10000" (="10h"). Therefore, the operation signal 161N5 of the operation signals 161N has a high level, and the operation signals 161N1-161N4 of the operation signals 161N have a low level. The operation signal 162N5 of the operation signals 162N has a high level, and the operation signals 162N1-162N4 of the operation signals 162N have a low level.

All of the AND circuits in the preliminary circuit 163 output an operation signal having a low level irrespective of the level of the impedance control signals DRZQN21-DRZQN25. Therefore, all of the operation signals 163N become a low level.

Thus, the pull-down circuits PD (See FIG. 2 of U.S. Pat. No. 7,215,128, incorporated herein by reference) in the unit buffers 111-114, 121, and 122 are turned on at 240Ω, which is the same impedance as the pull-down circuit 133 in the calibration circuit 130 (See FIG. 3 of U.S. Pat. No. 7,215,128, incorporated herein by reference). All of the pull-down circuit PD (See FIG. 2 of U.S. Pat. No. 7,215,128, incorporated herein by reference) in the buffer unit 123 and the pull-up circuits PU (See FIG. 2 of U.S. Pat. No. 7,215,128, incorporated herein by reference) in the unit buffers 111-114 and 121-123 are turned off. In other words, since all of the pull-down circuits PD in the six unit buffers 111-114, 121, and 122 are turned on accurately at 240Ω, the data terminal DQ is driven into a low level (GND potential) more accurately at an impedance of 40Ω (=240Ω/6) by the output buffer 101.

An MRS command is supplied as the command signal CMD from the memory controller to the command terminal 12a of the semiconductor device 10 at time t3. At that time, a DS setting code of "01" and an ODT setting code of "010" are supplied as the address signal ADD to the address terminal 13 of the semiconductor device 10. The memory controller maintains the on-die termination terminal 12b at a low level.

Thus, the controller circuit 21 outputs a mode register signal MRS to the mode register 22. The controller circuit 21 maintains the internal on-die termination control signal IODT at an inactive level (low level).

The mode register 22 outputs the DS setting signal and the ODT setting signal to the correction circuit 40.

When the DS setting signal is inputted to the correction circuit 40 from the mode register 22, the multiplexer 50m of the correction circuit 40 selects 5-bit data ("5'b11111"="1Fh") stored in the correction value setting part 50m1 because the DS setting code is "01." The multiplexer 50m outputs the selected data as correction values d1-d5 (correction value d=−1) to the arithmetic unit 50a.

Furthermore, when the ODT setting signal is inputted to the correction circuit 40 from the mode register 22, the multiplexer 60m of the correction circuit 40 selects 5-bit data ("5'b00010"="02h") stored in the correction value setting part 60m3 because the ODT setting code is "010." The multiplexer 60m outputs the selected data as correction values o1-o5 (correction value o=+2) to the arithmetic unit 60a.

Since the calibration operation started at time t1 has been completed at that time, the impedance control signal DRZQ1 (impedance control signals DRZQN11-DRZQN15) has a level of "5'b10000" (="10h") as shown in FIG. 8.

The arithmetic unit 50a of the correction circuit 40 adds the correction value d (=−1) to the impedance control signal DRZQ1 (or subtracts 1 from the impedance control signal DRZQ1) and outputs an impedance control signal DRZQ2d of "5'b01111" (="0Fh").

The arithmetic unit 60a of the correction circuit 40 adds the correction value o (=2) to the impedance control signal DRZQ1 and outputs an impedance control signal DRZQ2o of "5'b10010" (="12h").

Since the internal on-die termination control signal IODT has a low level at that time, the multiplexer 40s of the correction circuit 40 selects the impedance control signal DRZQ2d and outputs an impedance control signal DRZQ2. The impedance control signal DRZQ2 has a level of "5'b01111" (="0Fh").

When a READ command is supplied as the command signal CMD to the controller circuit 21 via the command terminal 12a, the controller circuit 21 supplies a data output enable signal OE to the output controller circuit 150.

When the DS setting signal is inputted to the output controller circuit 150 from the mode register 22, the DS setting code is "01," the data DATA indicate "1," and the internal on-die termination control signal IODT has a low level. Therefore, when the data terminal DQ is to be driven into a high level, the output controller circuit 150 sets all of the selection signals 151P-153P at a low level and all of the selection signals 151N-153N at a low level. Thus, if some of the OR circuits in the preliminary circuits 161-163 are supplied with the impedance control signals DRZQP21-DRZQP25 having a low level as input signals, then those OR circuits output an operation signal having a low level. If some of the OR circuits in the preliminary circuits 161-163 are supplied with the impedance control signals DRZQP21-DRZQP25 having a high level as input signals, then those OR circuits output an operation signal having a high level.

At that time, as shown in FIG. 8, the impedance control signals DRZQ21-DRZQ25 have a level of "5'b01111" (="0Fh"). Therefore, the impedance control signals DRZQP21-DRZQP25 have a level of "5'b10000" (="10h"), which is logically inverse to the impedance control signals DRZQ21-DRZQ25. Accordingly, the operation signal 161P5 of the operation signals 161P has a high level, and the operation signals 161P1-161P4 of the operation signals 161P have a low level. The operation signal 162P5 of the operation signals 162P has a high level, and the operation signals 162P1-162P4 of the operation signals 162P have a low level. The operation signal 163P5 of the operation signals 163P has a high level, and the operation signals 163P1-163P4 of the operation signals 163P have a low level.

All of the AND circuits in the preliminary circuits 161-163 output an operation signal having a low level irrespective of the level of the impedance control signals DRZQN21-DRZQN25. Therefore, all of the operation signals 161N-163N become a low level.

Thus, the pull-up circuits PU (See FIG. 2 of U.S. Pat. No. 7,215,128, incorporated herein by reference) in the unit buffers 111-114 and 121-123 are turned on at (240+α)Ω, which is higher than the impedance of the pull-up circuits 131 and 132 (See FIG. 3 of U.S. Pat. No. 7,215,128, incorporated herein by reference) in the calibration circuit 130 (240Ω). All of the pull-down circuits PD (See FIG. 2 of U.S. Pat. No. 7,215,128, incorporated herein by reference) in the unit buffers 111-114 and 121-123 are turned off. In other words, since all of the pull-up circuits PU in the seven unit buffers 111-114 and 121-123 are turned on accurately at an impedance of (240+α)Ω, the data terminal DQ is driven into a high level (VDD potential) more accurately at an impedance that is closer to 34.3Ω (=240Ω/7) by the output buffer 101.

The value of α (>0) is calculated during a design process or measured during an evaluation process. The correction value (=−1) is set based upon the calculation results or the measurement results.

The impedance of six unit buffers is set at 240Ω between time t2 and time t3. When those six unit buffers are activated, the impedance of the output buffer 101 becomes 40Ω. Meanwhile, seven unit buffers are activated between time t3 and time t4. When those seven unit buffers are activated at an impedance of 240Ω, a voltage drop of a power supply line connected to the output buffer 101 (a power supply line for supplying a first power supply voltage VDD in this example) increases as compared to the case where six unit buffers are activated at an impedance of 240Ω. Therefore, a difference between voltages applied to the output buffer 101 and the data terminal DQ becomes small. Thus, the impedance of each of the seven unit buffers increases to a value that is higher than 240Ω, at which the seven unit buffers have been set. The impedance divided by 7 deviates higher than the set point of the impedance of the output buffer 101 (240Ω/7=about 34.3Ω). In other words, if the impedance of each of the seven unit buffers is left at 240Ω, at which the six unit buffers have been adjusted, even though the number of unit buffers being activated has changed from six to seven, then the impedance divided by 7 deviates from the set point impedance of the output buffer 101 more than in a case where six unit buffers are activated at an impedance of 240Ω. In the case where six unit buffers are activated at an impedance of 240Ω, less deviation is demonstrated because the impedance has been adjusted accurately at the set point impedance of (240Ω/6=40Ω) by setting the correction value at zero. If the number of unit buffers being activated changes from six to seven (the number of unit buffers being activated varies), a correction value of −1 is added to the impedance control signal DRZQ2 for the case where each of the six unit buffers is activated at 240Ω. Thus, the impedance control signal DRZQ2 for the case where the seven unit buffers are activated at an impedance of (240Ω+α) is generated. When each of the seven unit buffers is activated at an impedance of (240Ω+α), which is higher than 240Ω, a voltage drop of the power supply line is reduced. Therefore, the impedance of the output buffer 101 can be brought closer to the set point as compared to the case where each of the seven unit buffers is activated at an impedance of 240Ω.

When the DS setting signal is inputted to the output controller circuit 150 from the mode register 22, the DS setting code is "01," the data DATA indicate "1," and the internal on-die termination control signal IODT has a low level. Therefore, when the data terminal DQ is to be driven into a low level, the output controller circuit 150 sets all of the selection signals 151P-153P at a high level and all of the selection signals 151N-153N at a high level. Thus, all of the OR circuits in the preliminary circuits 161-163 output an operation signal having a high level irrespective of the level of the impedance control signals DRZQP21-DRZQP25. Therefore, all of the operation signals 161P-163P become a high level.

If some of the AND circuits in the preliminary circuits 161-163 are supplied with the impedance control signals DRZQN21-DRZQN25 having a high level as input signals, then those AND circuits output an operation signal having a high level. If some of the AND circuits in the preliminary circuits 161-163 are supplied with the impedance control signals DRZQN21-DRZQN25 having a low level as input signals, then those AND circuits output an operation signal having a low level.

At that time, as shown in FIG. 8, the impedance control signals DRZQN21-DRZQN25 have a level of "5'b01111" (="0Fh"). Therefore, the operation signal 161N5 of the operation signals 161N has a low level, and the operation signals 161N1-161N4 of the operation signals 161N have a high level. The operation signal 162N5 of the operation signals 162N has a low level, and the operation signals 162N1-162N4 of the operation signals 162N have a high level. The operation signal 163N5 of the operation signals 163N has a low level, and the operation signals 163N1-163N4 of the operation signals 163N have a high level.

Thus, the pull-down circuits PD in the unit buffers 111-114 and 121-123 are turned on at an impedance of $(240+\alpha)$ Ω, which is higher than the impedance of the pull-down circuit 133 in the calibration circuit 130 (240Ω). All of the pull-up circuits PU in the unit buffers 111-114 and 121-123 are turned off. In other words, since all of the pull-down circuits PD in the seven unit buffers 111-114 and 121-123 are turned on accurately at $(240+\alpha)$ Ω, the data terminal DQ is driven into a low level (GND potential) more accurately at an impedance close to 34.2Ω (=240Ω/7) by the output buffer 101.

The memory controller changes the on-die termination terminal 12b from a low level to a high level at time t4 and sends an instruction to the controller circuit 21 such that the output buffer 101 (output circuit) functions as a terminating resistor. Thus, the controller circuit 21 changes the internal on-die termination control signal IODT to be supplied to the output controller circuit 150 from an inactive level (low level) into an active level (high level).

Since no MRS command is supplied as the command signal CMD to the semiconductor device 10 after time t3, the controller circuit 21 continues to output the mode register signal MRS to the mode register 22. The mode register 22 outputs the DS setting signal and the ODT setting signal generated by the operation from time t3, to the correction circuit 40.

Since the DS setting code was "01" at time t3, the multiplexer 50m of the correction circuit 40 selects 5-bit data ("5'b11111"="1 Fh") stored in the correction value setting part 50m1 and outputs the selected data as correction values d1-d5 (correction value d=−1) to the arithmetic unit 50a.

Since the ODT setting code was "010" at time t3, the multiplexer 60m of the correction circuit 40 selects 5-bit data ("5'b00010"="02h") stored in the correction value setting part 60m3 and outputs the selected data as correction values o1-o5 (correction value o=+2) to the arithmetic unit 60a.

The arithmetic unit 50a of the correction circuit 40 adds the correction value d (=−1) to the impedance control signal DRZQ1 (or subtracts 1 from the impedance control signal DRZQ1) during an operation after time t3 and outputs an impedance control signal DRZQ2d of "5'b01111" (="0Fh"). The arithmetic unit 60a of the correction circuit 40 adds the correction value o (=2) to the impedance control signal DRZQ1 and outputs an impedance control signal DRZQ2o of "5'b10010" (="12h").

Since the internal on-die termination control signal IODT has a high level at that time, the multiplexer 40s of the correction circuit 40 selects the impedance control signal DRZQ2o and outputs an impedance control signal DRZQ2. The impedance control signal DRZQ2 has a level of "5'b10010" (="12h").

Since the internal on-die termination control signal IODT having a high level is supplied to the output controller circuit 150, the output controller circuit 150 drives the data terminal DQ into an intermediate potential so that the output buffer 101 (output circuit) functions as a terminating resistor.

Since the ODT setting code is "010" and the internal on-die termination control signal IODT has a high level, the output controller circuit 150 sets the selection signal 152P at a low level, the selection signals 151P and 153P at a high level, the selection signal 152N at a high level, and the selection signals 151N and 153N at a low level.

Thus, if some of the OR circuits in the preliminary circuit 162 are supplied with the impedance control signals DRZQP21-DRZQP25 having a low level as input signals, then those OR circuits output an operation signal having a low level. If some of the OR circuits in the preliminary circuit 162 are supplied with the impedance control signals DRZQP21-DRZQP25 having a high level as input signals, then those OR circuits output an operation signal having a high level.

At that time, as shown in FIG. 8, the impedance control signals DRZQ21-DRZQ25 have a level of "5'b10010" (="12h"). Therefore, the impedance control signals DRZQP21-DRZQP25 have a level of "5'b01101" (="0Dh"), which is logically inverse to the impedance control signals DRZQ21-DRZQ25. Accordingly, the operation signals 162P4, 162P3, and 162P1 of the operation signals 162P have a high level, and the operation signals 162P5 and 162P2 of the operation signals 162P have a low level.

All of the OR circuits in the preliminary circuits 161 and 163 output an operation signal having a high level irrespective of the level of the impedance control signals DRZQP21-DRZQP25.

Therefore, all of the operation signals 161P and 163P become a high level.

If some of the AND circuits in the preliminary circuit 162 are supplied with the impedance control signals DRZQN21-DRZQN25 having a high level as input signals, then those AND circuits output an operation signal having a high level. If some of the AND circuits in the preliminary circuit 162 are supplied with the impedance control signals DRZQN21-DRZQN25 having a low level as input signals, then those AND circuits output an operation signal having a low level.

At that time, as shown in FIG. 8, the impedance control signals DRZQN21-DRZQN25 have a level of "5'b10010" (="12h"). Therefore, the operation signals 162N5 and 162N2 of the operation signals 162N have a high level, and the operation signals 162N4, 162N3, and 162N1 of the operation signals 162N have a low level.

All of the AND circuits in the preliminary circuits 161 and 163 output an operation signal having a low level irrespective of the level of the impedance control signals DRZQN21-DRZQN25.

Therefore, all of the operation signals 161N and 163N become a low level.

Thus, the pull-up circuits PU (See FIG. 2 of U.S. Pat. No. 7,215,128, incorporated herein by reference) in the unit buffers 121 and 122 are turned on at an impedance of $(240-\beta)$Ω, which is lower than the impedance of the pull-up circuits 131 and 132 (See FIG. 3 of U.S. Pat. No. 7,215,128, incorporated herein by reference) in the calibration circuit 130 (240Ω). The pull-down circuits PD (See FIG. 2 of U.S. Pat. No. 7,215,128, incorporated herein by reference) in the unit buffers 121 and 122 are turned on at an impedance of $(240-\beta)$Ω, which is lower than the impedance of the pull-down circuit 133 in the calibration circuit 130 (240Ω).

In other words, since all of the pull-up circuits PU and the pull-down circuits PD in the two unit buffers 121 and 122 are turned on accurately at an impedance of (240−β) Ω, the data terminal DQ is terminated into a potential of VDD/2 (intermediate potential) at an impedance that is closer to 120 Ω (=240Ω/2) by the output buffer 101.

As with α, the value of β (>0) is calculated during a design process or measured during an evaluation process. The correction value (=2) is set based upon the calculation results or the measurement results.

When the ODT setting code is set to be "011" (correction value o=0) so that the output buffer 101 functions as a terminating resistor, the impedance of six unit buffers are set at 240Ω. When those six unit buffers are activated, the impedance of the output buffer 101 becomes 40Ω. Meanwhile, two unit buffers are activated between time t4 and time t5. When those two unit buffers are activated at an impedance of 240Ω, a voltage drop of a power supply line connected to the output buffer 101 (a power supply line for supplying a first power supply voltage VDD in this example) decreases as compared to the case where six unit buffers are activated at an impedance of 240Ω. Therefore, a difference between voltages applied to the output buffer 101 and the data terminal DQ becomes large. Thus, the impedance of each of the two unit buffers decreases to a value that is lower than 240Ω, at which the two unit buffers have been set. The impedance divided by 2 deviates lower than the set point of the impedance of the output buffer 101 (240Ω/2=about 120Ω). In other words, if the impedance of each of the two unit buffers is left at 240Ω, at which the six unit buffers have been adjusted, even though the number of unit buffers being activated has changed from six to two, then the impedance divided by 2 deviates from the set point impedance of the output buffer 101 more than in a case where six unit buffers are activated at an impedance of 240Ω. In the case where six unit buffers are activated at an impedance of 240Ω, less deviation is demonstrated because the impedance has been adjusted accurately at the set point impedance of (240Ω/6=40Ω) by setting the correction value at zero. If the number of unit buffers being activated changes from six to two (the number of unit buffers being activated varies), a correction value of 2 is added to the impedance control signal DRZQ2 for the case where each of the six unit buffers is activated at 240Ω. Thus, the impedance control signal DRZQ2 for the case where the two unit buffers are activated at an impedance of (240Ωβ) is generated. When each of the two unit buffers is activated at an impedance of (240Ω−β), which is lower than 240Ω, a voltage drop of the power supply line is increased as compared to the case where each of the two unit buffers is activated at an impedance of 240Ω. Therefore, the impedance of the output buffer 101 can be brought closer to the set point.

When the memory controller changes the on-die termination terminal 12b from a high level to a low level at time t5, the level of the impedance control signal DRZQ2 returns to the level prior to time t4. The semiconductor device 10 proceeds to a state in which a data output operation can be performed. In other words, the semiconductor device 10 proceeds to a state in which the data DATA can be outputted from the memory cell array 20 to the data terminal DQ as with the state from time t3 to time t4.

As described above, the semiconductor device 10 has an output circuit (output buffer 101) including a plurality of unit buffers each having an adjustable impedance, a controller circuit (output controller circuit 150) operable to selectively activate one or more unit buffers from among the plurality of unit buffers, and an impedance adjustment part (impedance adjustment part 30) operable to adjust an impedance of each of the plurality of unit buffers in response to a change of the number of the one or more unit buffers being selectively activated by the controller circuit.

With this configuration, according to the present invention, the impedance of each of the unit buffers (unit buffers 111-114 and 121-123) is adjusted in response to a change of the number of the one or more unit buffers being selectively activated by the controller circuit (output controller circuit 150). Therefore, a deviation from a set point of the impedance of the output circuit that is caused by a difference of the number of unit buffers being activated can be reduced. Accordingly, the accuracy of adjustment of the impedance of the output circuit (output buffer 101) can be improved.

Figure 9:
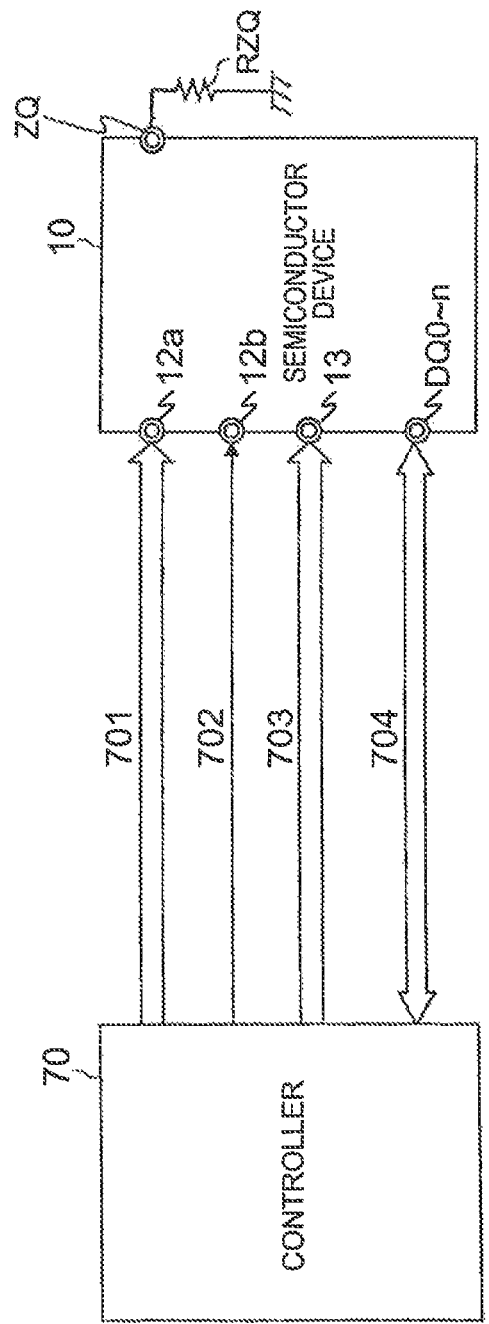
FIG. 9 is a block diagram showing a data processing system including the semiconductor device 10.

FIG. 9 is a block diagram showing a data processing system including the semiconductor device 10. In FIG. 9, the terminals of the semiconductor device 10 are denoted by the same reference numerals as in FIG. 1, and the explanation thereof is omitted herein.

The data processing system illustrated in FIG. 9 includes the semiconductor device 10 and a controller 70. The semiconductor device 10 and the controller 70 are connected to each other via a command bus 701, an ODT setting signal line 702, an address bus 703, and a data bus 704. When the settings of the mode register in the semiconductor device 10 are to be updated, the controller 70 issues an MRS command and supplies the MRS command to the semiconductor device 10 via the command bus 701. The controller 70 also supplies a predetermined code, specifically a DS setting code or an ODT setting code, to the semiconductor device 10 via the address bus 703. When a calibration operation is to be performed on the semiconductor device 10, the controller 70 issues a CAL command and supplies the CAL command to the semiconductor device 10 via the command bus 701. When a data output operation is to be performed on the semiconductor device 10, the controller 70 issues a read command in a state in which the memory cell array of the semiconductor device 10 is activated. The controller 70 supplies the read command to the semiconductor device 10 via the command bus 701. The controller 70 also supplies a column address to the semiconductor device 10 via the address bus 703. At that time, the memory controller 70 holds the ODT terminal 12b of the semiconductor device 10 at an inactive low level via the ODT setting signal line 702. The semiconductor device 10 performs a data output operation and supplies output data to the memory controller via the data bus 704. When an ODT operation is to be performed on the semiconductor device 10, the controller 70 changes the level of the ODT terminal 12b of the semiconductor device 10 from an inactive low level to an active high level via the ODT setting signal line 702.

According to embodiments of the present invention, the impedance of each of a plurality of unit buffers is adjusted in response to a change of the number of the one or more unit buffers being selectively activated by a controller circuit. Therefore, a deviation from a set point of the impedance of an output circuit that is caused by a difference of the number of unit buffers being activated can be reduced. Accordingly, the accuracy of adjustment of the impedance of the output buffer (output circuit) can be improved.

Figure 10:
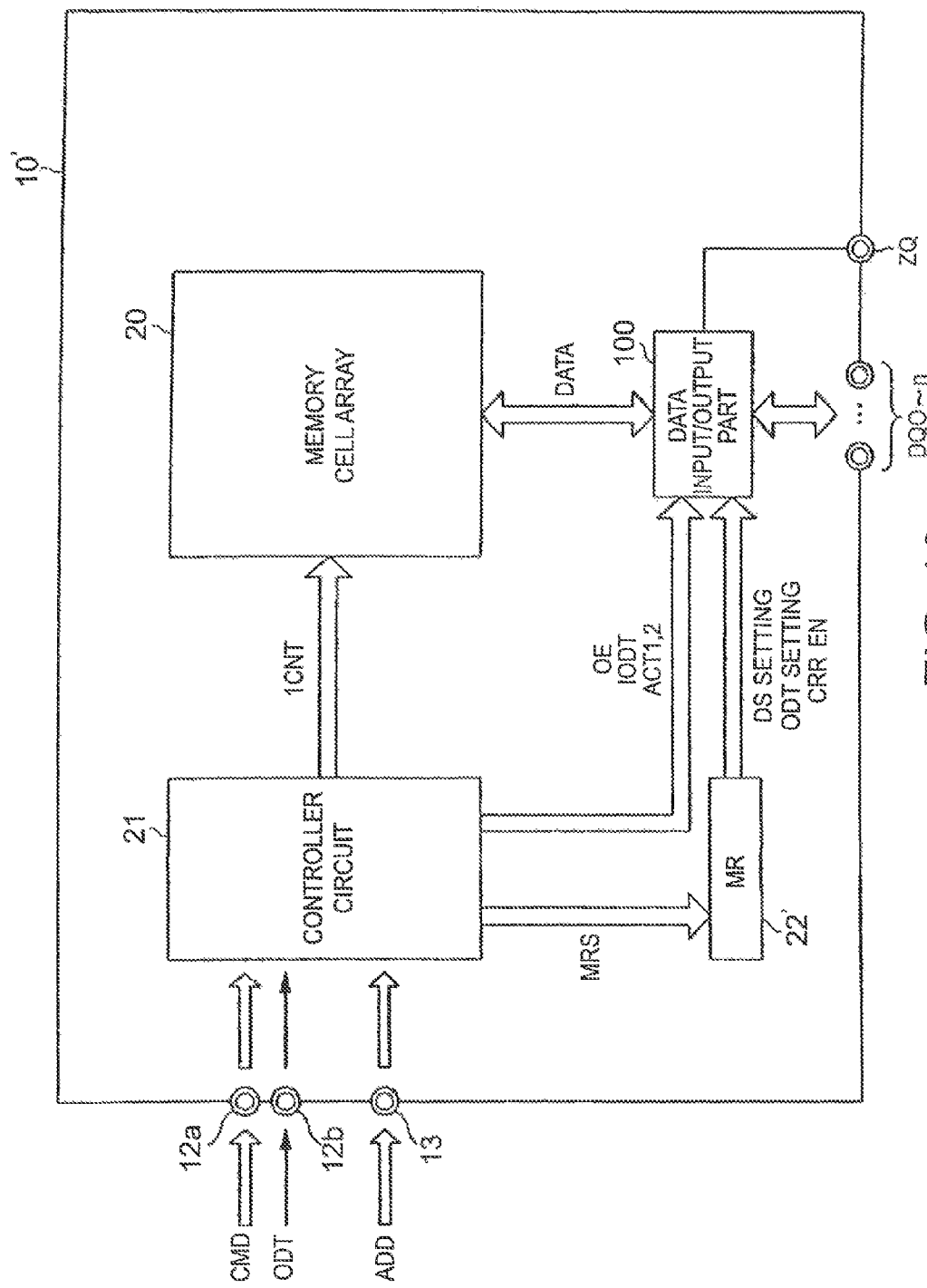
FIG. 10 is a block diagram showing a configuration of a semiconductor device 10' according to another exemplary embodiment of the present invention.

FIG. 10 is a block diagram showing another semiconductor device to which the present invention is applicable. In FIG. 10, some components are designated by same reference symbols as those in FIG. 1 and description thereof will be omitted.

The semiconductor device 10' illustrated in FIG. 10 is different from the semiconductor device 10 illustrated in FIG. 1 in that a mode register 22' supplies a correction enable signal CRR EN to the data input/output part. When the correction enable signal CRR EN of an active level is supplied from the mode register 22', the data input/output part activates its own correction circuit 40 and executes the above-mentioned correction operation for the impedance control signals DRZQ1. On the other hand, when the correction enable signal CRR EN has an inactive level, the data input/output part stops the correction operation for the impedance control signals DRZQ1 at its own correction circuit 40. When the correction operation is stopped, the data input/output part outputs the impedance control signal DRZQ1 as impedance control signals DRZQ2 without any correction or change.

When the semiconductor device 10' is mounted to the data processing system illustrated in FIG. 9 instead of the semiconductor device 10, the controller 70 sets an active level or an inactive level of the correction enable signal CRR EN of the semiconductor device 10' by using a mode register set command and a predetermined setting code. In this manner, it is possible to control execution or non-execution of the correction operation for the impedance control signals of the semiconductor device 10'.

In the foregoing, description has been made of the structure in which an active state or an inactive state of the correction circuit 40 is controlled by using the mode register. Alternatively, instead of using the mode register, the controller circuit 21 may control an active state or an inactive state of the correction circuit 40. In this case, the controller 70 supplies a signal indicative of an active state or an inactive state of the correction circuit 40 via an address terminal to the semiconductor device together with a calibration command.

The technical concept of the present application is applicable to semiconductor devices having various functions other than a memory function. The circuit configurations of each of the illustrated circuit blocks and other circuits for generating a control signal are not limited to those disclosed in the above embodiments.

The technical concept of a semiconductor device according to the present invention is applicable to various semiconductor devices. For example, the present invention is applicable to general semiconductor devices such as a central processing unit (CPU), a micro control unit (MCU), a digital signal processor (DSP), an application specific integrated circuit (ASIC), an application specific standard product (ASSP), and a memory. Furthermore, examples of semiconductor devices to which the present invention can be applied include semiconductor devices using technology including system-on-a-chip (SOC), multi-chip package (MCP), and package-on-package (POP). The present invention is applicable to any semiconductor device having such product forms or package forms. Moreover, transistors used should be a field effect transistor (FET). However, various types of FETs including a metal oxide semiconductor (MOS), a metal-insulator semiconductor (MIS), and a thin film transistor (TFT) may be used for such transistors. Furthermore, the semiconductor device may include some bipolar transistors.

Furthermore, an N-type channel MOS transistor (NMOS transistor) is a typical example of a first conductive type of transistors, and a P-type channel transistor (PMOS transistor) is a typical example of a second conductive type of transistors.

The disclosed elements may be combined or selected in various ways within the scope of the appended claims of the present invention. In other words, the present invention includes a variety of variations and modifications that would be apparent to those skilled in the art from the entire disclosure and technical concept including the appended claims.

What is claimed is:

1. A device comprising:
an output circuit including a plurality of unit buffers, each of the unit buffers having an adjustable impedance;
a controller circuit operable to selectively activate at least one of the unit buffers; and
an impedance adjustment part operable to adjust the impedance of each of the unit buffers in response to a change of the number of the unit buffers that are selectively activated by the controller circuit; and
a first terminal configured to be coupled to an external resistor, and wherein the impedance adjustment part includes:
an impedance adjustment circuit operable to generate a first impedance adjustment signal in response to a resistance of the external resistor; and
a correction circuit receiving the first impedance adjustment signal and operable to perform a correction for the first impedance adjustment signal to generate a second impedance adjustment signal, the correction corresponding to the number of the unit buffers that are selectively activated by the controller circuit, and supplying the second impedance adjustment signal to the unit buffers to adjust the impedance of each of the unit buffers.

2. The device as recited in claim 1, wherein the correction circuit comprises:
a first correction value memory part operable to store a plurality of preset correction values,
a selection circuit operable to select one of the preset correction values in response to the number of the unit buffers that are selectively activated by the controller circuit, and
an addition circuit operable to add the one of the preset correction values to the first impedance adjustment signal to generate the second impedance adjustment signal.

3. The device as recited in claim 2, further comprising:
a mode register operable to store data indicative of the number of the unit buffers, and
wherein the first correction value memory part includes a plurality of second correction value memory parts, each of the second correction value memory parts storing an associated one of the preset correction values,
the mode register is operable to output a setting signal in response to the data indicative of the number of the unit buffers, and
the selection circuit is operable to select one of the second correction value memory parts in response to the setting signal when the setting signal is inputted to the selection circuit.

4. The device as recited in claim 3, further comprising:
an output terminal,
wherein each of the unit buffers includes;
a pull-up circuit operable to drive the output terminal into a first power supply voltage level, and
a pull-down circuit operable to drive the output terminal into a second power supply voltage level,
the setting signal includes a first setting signal and a second setting signal, and
the controller circuit is operable to
activate one of the pull-up circuit and the pull-down circuit depending upon the first setting signal so as to drive the output terminal when a read command is inputted to the device, the read command performing an operation of reading data stored within the device and outputting the data to the output terminal, and activate both of the pull-up circuits and the pull-down circuits depending upon the second setting signal so as to drive a second terminal when an on-die termination signal is inputted to the device, the on-die termination signal instructing the output circuit to function as a terminating resistor.

5. The device as recited in claim 2, wherein the first correction value memory part includes a nonvolatile memory element, and
the preset correction values are written into the nonvolatile memory element when a test command is supplied externally to the device.

6. The device as recited in claim 1, further comprising an output terminal, and wherein the unit buffers are coupled in common to the output terminal.

7. The device as recited in claim 1, wherein the controller circuit is operable to activate a first number of the unit buffers in a first operation mode and activate a second number of the unit buffers in a second operation mode.

8. The device as recited in claim 7, wherein the first number is different from the second number.

9. The device as recited in claim 7, wherein the first operation mode is a data output mode and the second operation mode is an ODT mode.

10. A data processing system comprising;
a controller unit; and
a memory device coupled to the controller unit, the memory device comprising;
an output circuit including a plurality of unit buffers, each of the unit buffers having an adjustable impedance;
a controller circuit operable to selectively activate at least one of the unit buffers;
an impedance adjustment part operable to adjust the impedance of each of the unit buffers in response to a change of the number of the unit buffers that are selectively activated by the controller circuit
an external resistor; and
a first terminal coupled to the external resistor, wherein the impedance adjustment part includes:
an impedance adjustment circuit operable to generate a first impedance adjustment signal in response to a resistance of the external resistor; and
a correction circuit receiving the first impedance adjustment signal and operable to perform a correction for the first impedance adjustment signal to generate a second impedance adjustment signal, the correction corresponding to the number of the unit buffers that are selectively activated by the controller circuit, and supplying the second impedance adjustment signal to the unit buffers to adjust the impedance of each of the unit buffers.

11. The data processing system as recited in claim 10, wherein the correction circuit comprises:
a first correction value memory part operable to store a plurality of preset correction values,
a selection circuit operable to select one of the preset correction values in response to the number of the unit buffers that are selectively activated by the controller circuit, and
an addition circuit operable to add the one of the preset correction values to the first impedance adjustment signal to generate the second impedance adjustment signal.

12. The data processing system as recited in claim 11, wherein the memory device further comprises:
a mode register operable to store data indicative of the number of the unit buffers, and
wherein the first correction value memory part includes a plurality of second correction value memory parts, each of the second correction value memory parts storing an associated one of the preset correction values,
the mode register is operable to output a setting signal in response to the data indicative of the number of the unit buffers, and
the selection circuit is operable to select one of the second correction value memory parts in response to the setting signal when the setting signal is inputted to the selection circuit.

13. The data processing system as recited in claim 12, wherein the memory device further comprises:
an output terminal,
wherein each of the unit buffers includes;
a pull-up circuit operable to drive the output terminal into a first power supply voltage level, and
a pull-down circuit operable to drive the output terminal into a second power supply voltage level,
the setting signal includes a first setting signal and a second setting signal, and
the controller circuit is operable to:
activate one of the pull-up circuit and the pull-down circuit depending upon the first setting signal so as to drive a output terminal when a read command is inputted to the device, the read command performing an operation of reading data stored within the device and outputting the data to the output terminal, and
activate both of the pull-up circuits and the pull-down circuits depending upon the second setting signal so as to drive a second terminal when an on-die termination signal is inputted to the device, the on-die termination signal instructing the output circuit to function as a terminating resistor.

14. The system as recited in claim 11, wherein the first correction value memory part includes a nonvolatile memory element, and
the preset correction values are written into the nonvolatile memory element when a test command is supplied externally to the device.

15. The system as recited in claim 10, wherein the memory device further comprises an output terminal, and wherein the unit buffers are coupled in common to the output terminal.

16. The system as recited in claim 10, wherein the controller circuit is operable to activate a first number of the unit buffers in a first operation mode and activate a second number of the unit buffers in a second operation mode.

17. The system as recited in claim 16, wherein the first number is different from the second number.

18. The system as recited in claim 16, wherein the first operation mode is a data output mode and the second operation mode is an ODT mode.

* * * * *